US012666590B2

(12) United States Patent
Kim et al.

(10) Patent No.: US 12,666,590 B2
(45) Date of Patent: Jun. 23, 2026

(54) SEMICONDUCTOR MEMORY DEVICE AND METHOD FOR FABRICATING THE SAME

(71) Applicant: Samsung Electronics Co., Ltd., Suwon-si (KR)

(72) Inventors: Beom Seo Kim, Suwon-si (KR); Sung Gil Kim, Suwon-si (KR); Ji Hun Noh, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 634 days.

(21) Appl. No.: 18/062,264

(22) Filed: Dec. 6, 2022

(65) Prior Publication Data

US 2023/0328963 A1 Oct. 12, 2023

(30) Foreign Application Priority Data

Apr. 7, 2022 (KR) ........................ 10-2022-0043319

(51) Int. Cl.
*H10B 12/00* (2023.01)

(52) U.S. Cl.
CPC ....... *H10B 12/0335* (2023.02); *H10B 12/053* (2023.02); *H10B 12/315* (2023.02); *H10B 12/34* (2023.02)

(58) Field of Classification Search
CPC .............. H10B 12/0335; H10B 12/053; H10B 12/315; H10B 12/34
See application file for complete search history.

(56) References Cited

U.S. PATENT DOCUMENTS 9,177,891 B2 11/2015 Kim et al.
9,613,966 B2 4/2017 Kim et al.
(Continued)

FOREIGN PATENT DOCUMENTS

CN 106206584 A 12/2016
KR 20020045893 A 6/2002
(Continued)

OTHER PUBLICATIONS

Taiwanese Office Action dated Nov. 1, 2023 issued in Taiwanese Patent Application No. 112112947.
(Continued)

*Primary Examiner* — Brent A. Fairbanks
*Assistant Examiner* — Molly K Reida
(74) *Attorney, Agent, or Firm* — Harness, Dickey & Pierce, P.L.C.

(57) ABSTRACT
A semiconductor memory device including a substrate including an active area defined by an element isolation layer, a bit line extending in a first direction on the substrate, a storage contact on each of both sides of the bit line and connected to the active area, a storage pad on the storage contact and connected to the storage contact and an information storage portion on the storage pad and connected to the storage pad, wherein the storage contact includes a lower storage contact and an upper storage contact on the lower storage contact, at least a portion of the lower storage contact is in the substrate, an entire upper surface of the lower storage contact is in contact with an entire lower surface of the upper storage contact, and each of the lower storage contact and the upper storage contact includes a semiconductor material may be provided.

17 Claims, 22 Drawing Sheets

(56)  References Cited

U.S. PATENT DOCUMENTS

| | | | |
|---|---|---|---|
| 10,211,210 B2 | 2/2019 | Ma et al. | |
| 10,586,798 B2 | 3/2020 | Kim et al. | |
| 10,658,367 B1 | 5/2020 | Simsek-Ege | |
| 10,790,150 B2 | 9/2020 | Kim et al. | |
| 2015/0061134 A1* | 3/2015 | Lee | H01L 21/76895 |
| | | | 257/751 |
| 2015/0214152 A1* | 7/2015 | Park | H10B 12/0335 |
| | | | 257/774 |
| 2017/0345824 A1* | 11/2017 | Ma | H01L 21/76805 |
| 2018/0301459 A1* | 10/2018 | Kim | H10B 12/482 |

FOREIGN PATENT DOCUMENTS

| | | |
|---|---|---|
| KR | 10-2015-0089839 A | 8/2015 |
| KR | 10-2017-0134928 A | 12/2017 |
| TW | 432640 B | 5/2001 |
| TW | 463368 B | 11/2001 |
| TW | 558766 B | 10/2003 |

OTHER PUBLICATIONS

Korean Office Action dated Nov. 12, 2025 issued in Korean Patent Application No. 10-2022-0043319.

* cited by examiner 193
192 }190
191

SEMICONDUCTOR MEMORY DEVICE AND METHOD FOR FABRICATING THE SAME

CROSS-REFERENCE TO RELATED APPLICATION

This application claims priority to and all the benefits accruing from Korean Patent Application No. 10-2022-0043319 filed on Apr. 7, 2022 in the Korean Intellectual Property Office, under 35 U.S.C. 119, the contents of which in their entirety are herein incorporated by reference.

BACKGROUND

1. Technical Field

The present disclosure relates to semiconductor memory devices and/or methods for fabricating the same, and more particularly, to semiconductor memory devices having a plurality of wiring lines and buried contacts intersecting each other, and/or methods for fabricating the same.

2. Description of the Related Art

As semiconductor elements are increasingly highly integrated, individual circuit patterns are becoming more miniaturized in order to implement more semiconductor elements on the same area. That is, as the degree of integration of the semiconductor element increases, a design rule for the components of the semiconductor element decreases.

In a highly scaled semiconductor element, a process of forming a plurality of wiring lines and a plurality of buried contacts BC interposed therebetween becomes increasingly complex and difficult.

SUMMARY

Some aspects of the present disclosure provide semiconductor memories device capable of improving reliability and performance.

Some aspects of the present disclosure also provide methods for fabricating a semiconductor device capable of improving reliability and performance.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a semiconductor memory device includes a substrate including an active area defined by an element isolation layer, a bit line extending in a first direction on the substrate, a storage contact on each of both sides of the bit line and connected to the active area, a storage pad on the storage contact and connected to the storage contact and an information storage portion on the storage pad and connected to the storage pad, wherein the storage contact includes a lower storage contact and an upper storage contact on the lower storage contact, at least a portion of the lower storage contact is in the substrate, an entirety of an upper surface of the lower storage contact is in contact with an entirety of a lower surface of the upper storage contact, and each of the lower storage contact and the upper storage contact includes a semiconductor material.

According to another aspect of the present disclosure, a semiconductor memory device includes a substrate including an active area defined by an element isolation layer, a bit line structure including a bit line extending in a first direction and a bit line spacer on a sidewall of the bit line on the substrate, a storage contact disposed on each of both sides of the bit line structure and connected to the active area, a storage pad formed on the storage contact and connected to the storage contact and an information storage portion formed on the storage pad and connected to the storage pad, wherein the storage contact includes a lower storage contact and an upper storage contact on the lower storage contact, at least a portion of the lower storage contact is in the substrate, the bit line spacer does not extend along an upper surface of the lower storage contact, and each of the lower storage contact and the upper storage contact includes a semiconductor material.

According to still another aspect of the present disclosure, a semiconductor memory device includes a substrate including an active area extending in a first direction and defined by an element isolation layer, the active area including a first portion and a second portion defined on both sides of the first portion, a word line extending in a second direction and crossing between the first portion of the active area and the second portion of the active area, in the substrate and the element isolation layer, a bit line extending in a third direction and connected to the first portion of the active area, on the substrate and the element isolation layer, a storage contact on each of both sides of the bit line and connected to the second portion of the active area, a storage pad formed on the storage contact and connected to the storage contact, a contact silicide layer between the storage contact and the storage pad and a capacitor formed on the storage pad and connected to the storage pad, wherein the storage contact includes a lower storage contact and an upper storage contact on the lower storage contact, and an entirety of an upper surface of the lower storage contact is in contact with an entirety of a lower surface of the upper storage contact.

BRIEF DESCRIPTION OF THE DRAWINGS

The above and other aspects and features of the present disclosure will become more apparent by describing in detail some example embodiments thereof with reference to the attached drawings, in which:

FIG. 7 is a view schematically illustrating an impurity concentration along a scan line of FIG. 3.

FIGS. 12 to 22 are intermediate step views for describing a method for fabricating a semiconductor memory device according to an example embodiment.

DETAILED DESCRIPTION

Figure 1:
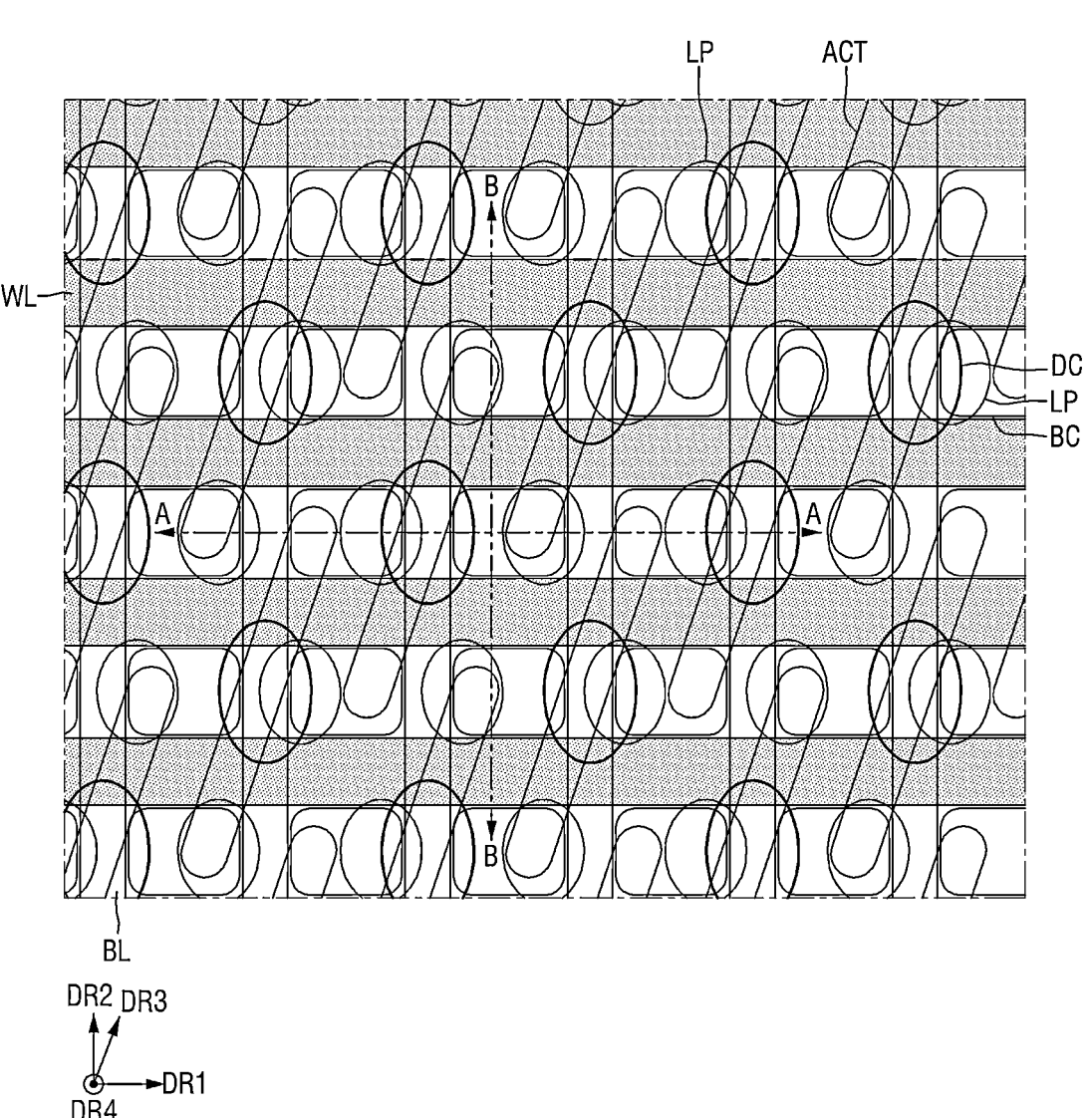
FIG. 1 is a schematic layout of a semiconductor memory device according to an example embodiment.
Figure 2:
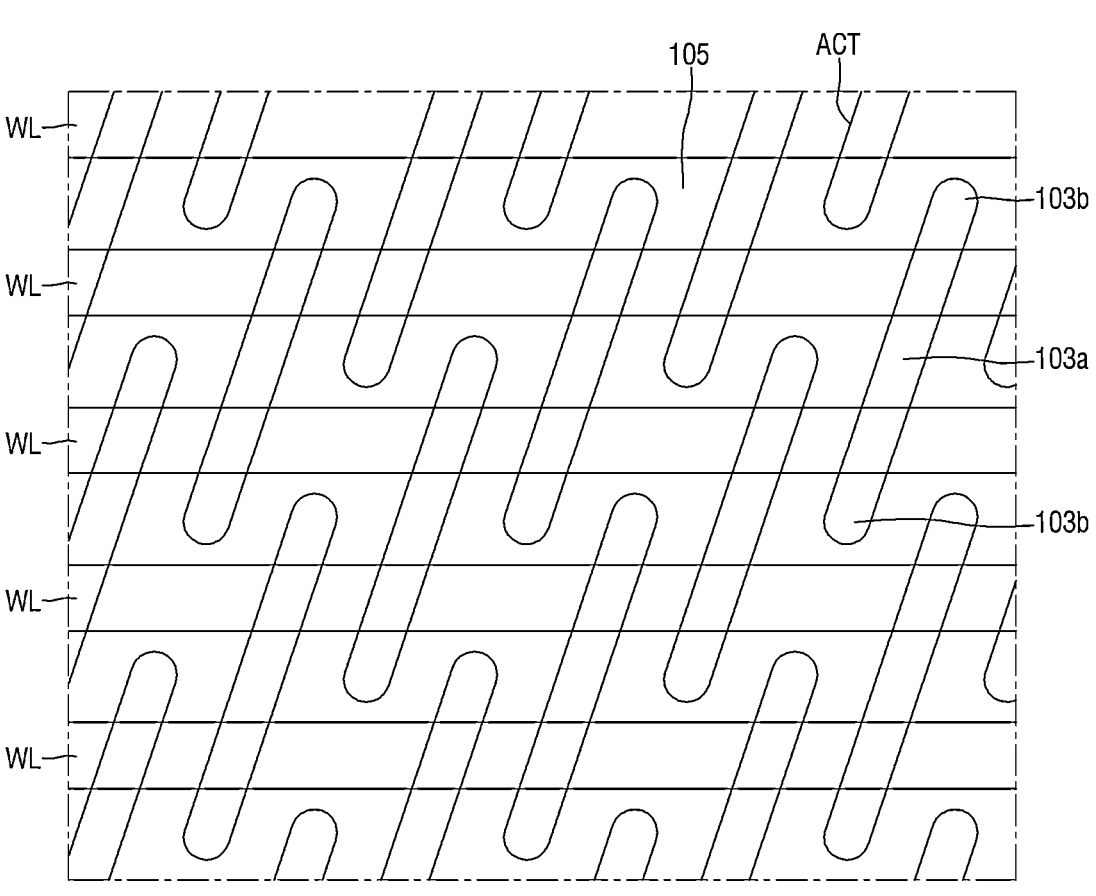
FIG. 2 is a layout illustrating only a word line and an active area of FIG. 1.
Figure 2:
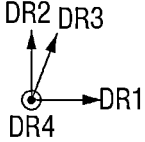
Figure 3:
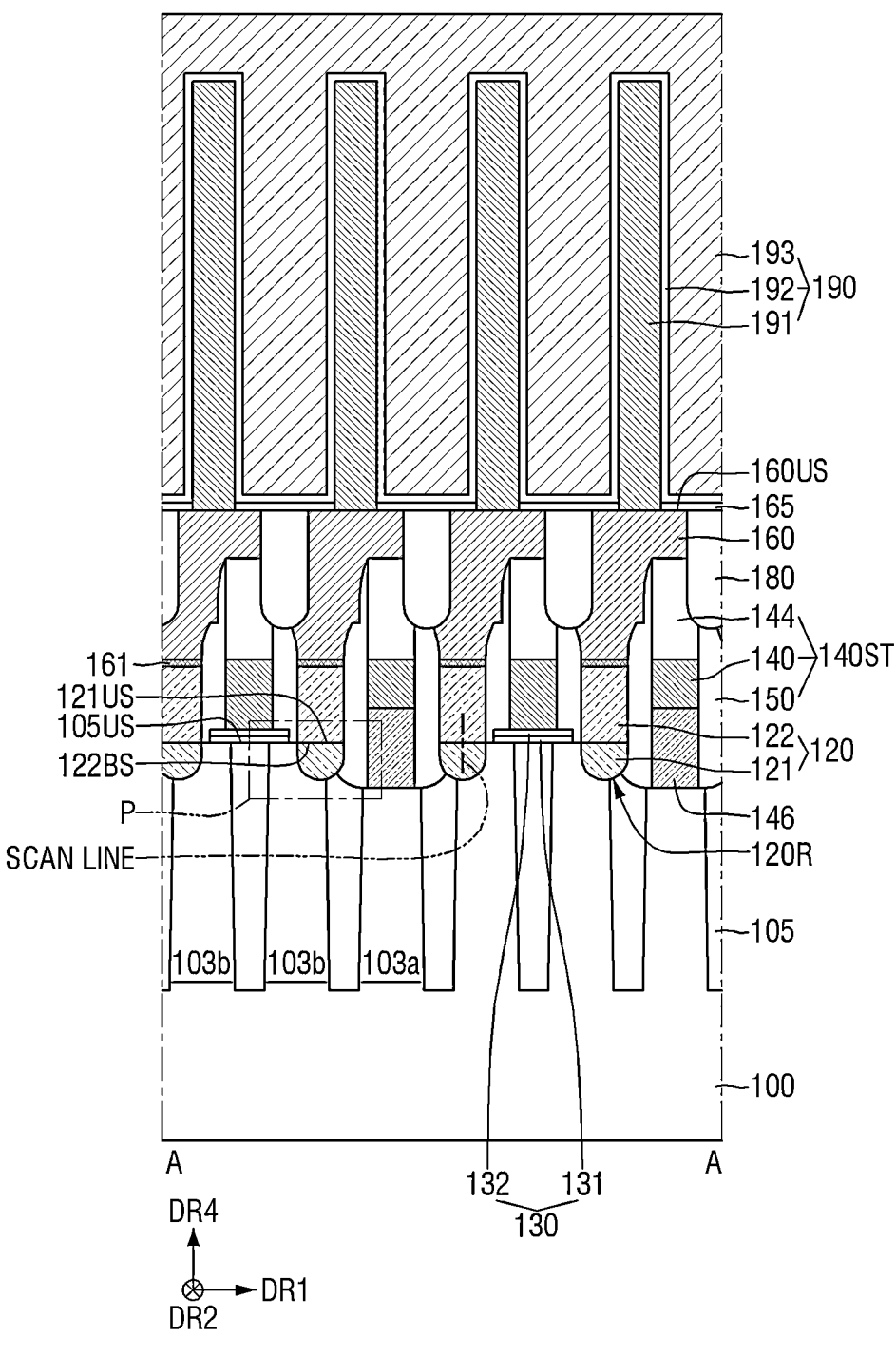
FIG. 3 is an example cross-sectional view taken along line A-A of FIG. 1.
Figure 4:
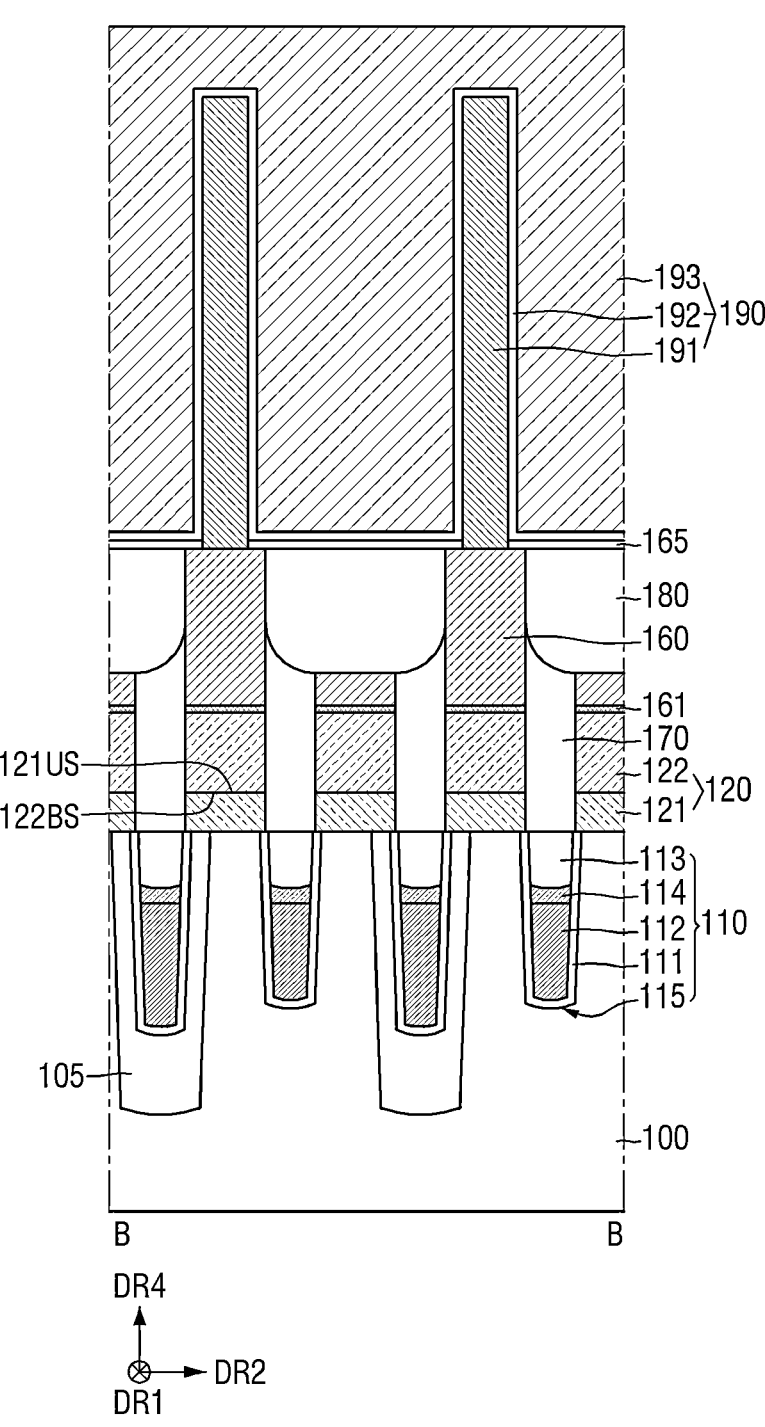
FIG. 4 is an example cross-sectional view taken along line B-B of FIG. 1.
Figure 5:
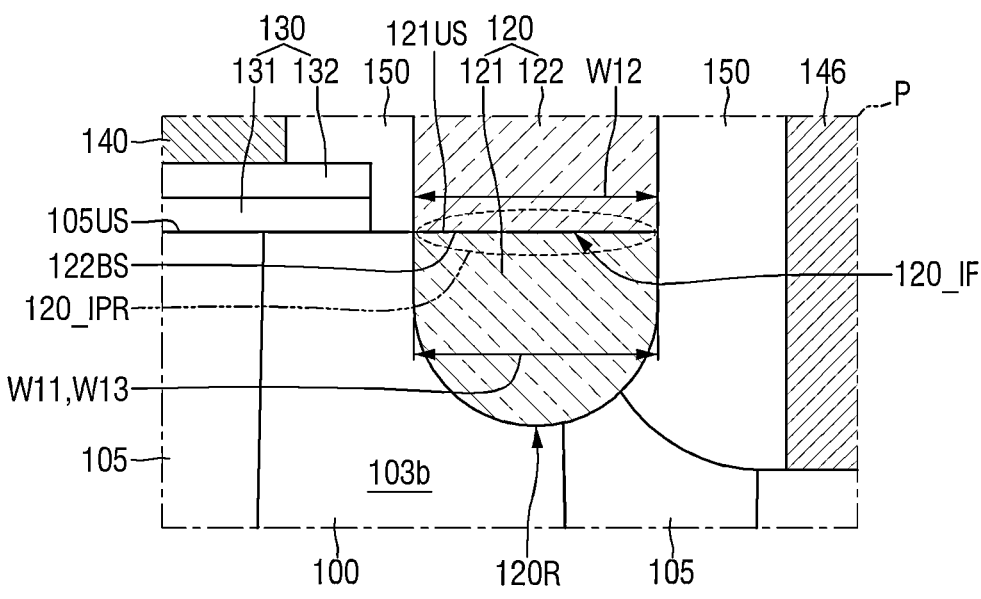
FIGS. 5 and 6 are enlarged views of part P of FIG. 3.
Figure 6:
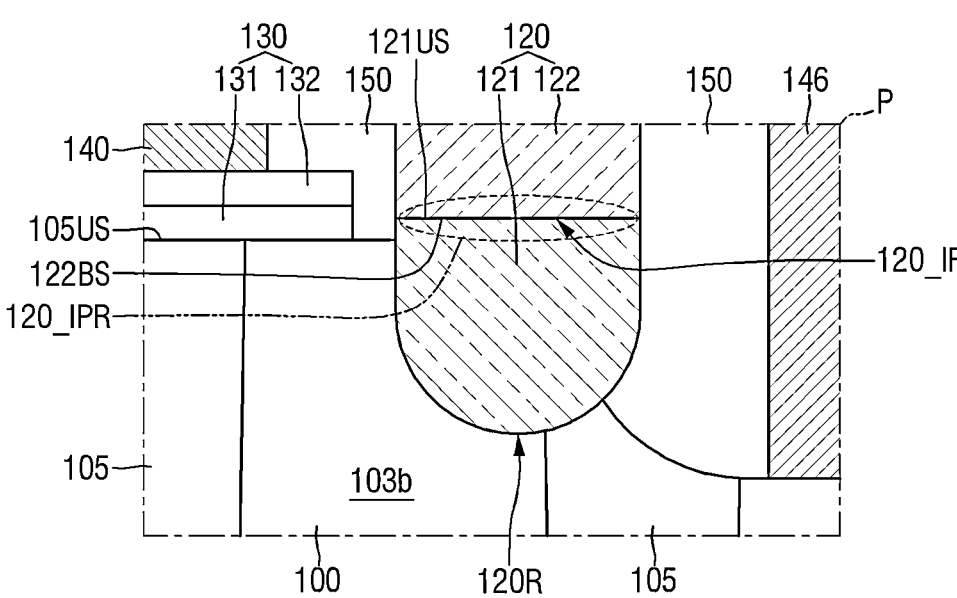
Figure 7:
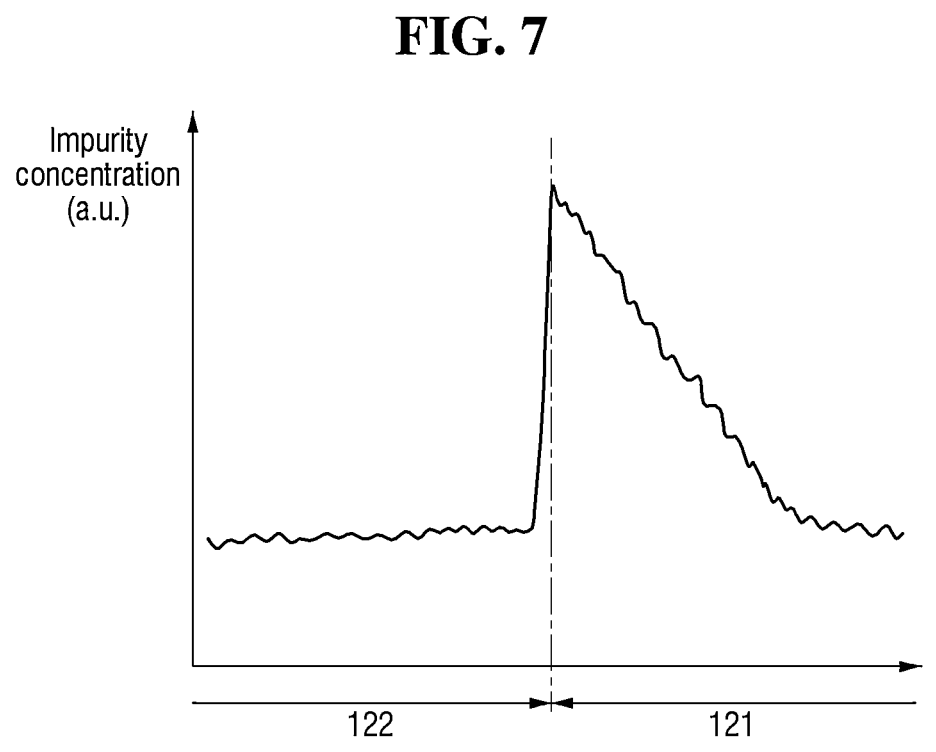

FIG. 1 is a schematic layout of a semiconductor memory device according to an example embodiment. FIG. 2 is a layout illustrating only a word line and an active area of FIG. 1. FIG. 3 is an example cross-sectional view taken along line A-A of FIG. 1. FIG. 4 is an example cross-sectional view taken along line B-B of FIG. 1. FIGS. 5 and 6 are enlarged views of part P of FIG. 3. FIG. 7 is a view schematically illustrating an impurity concentration along a scan line of FIG. 3.

In the drawings of a semiconductor memory device according to an example embodiment, a dynamic random access memory (DRAM) is illustrated, but the present disclosure is not limited thereto.

Referring to FIGS. 1 and 2, the semiconductor memory device according to an example embodiment may include a plurality of active areas ACT.

The cell active area ACT may be defined by a cell element isolation layer 105 formed in a substrate (100 in FIG. 3). As a design rule of the semiconductor memory device is reduced, the cell active area ACT may be disposed in a bar shape of a diagonal line or an oblique line as illustrated. For example, the cell active area ACT may extend in a third direction DR3.

A plurality of gate electrodes extending in the first direction DR1 across the cell active area ACT may be disposed. The plurality of gate electrodes may extend to be parallel to each other. The plurality of gate electrodes may be, for example, a plurality of word lines WL. The word lines WL may be disposed at equal intervals. A width of the word lines WL or an interval between the word lines WL may be determined according to a design rule.

Each cell active area ACT may be divided into three portions by two word lines WL extending in the first direction DR1. The cell active area ACT may include a storage connection portion 103b and a bit line connection portion 103a. The bit line connection portion 103a may be positioned at a central portion of the cell active area ACT, and the storage connection portion 103b may be positioned at an end portion of the cell active area ACT.

For example, the bit line connection portion 103a may be an area connected to a bit line BL, and the storage connection portion 103b may be an area connected to an information storage portion (190 in FIG. 3). In other words, the bit line connection portion 103a may correspond to a common drain area, and the storage connection portion 103b may correspond to a source area. Each word line WL and the bit line connection portion 103a and the storage connection portion 103b adjacent thereto may constitute a transistor.

A plurality of bit lines BL extending in a second direction DR2 orthogonal to the word line WL may be disposed on the word line WL. The plurality of bit lines BL may extend to be parallel to each other. The bit lines BL may be disposed at equal intervals. A width of the bit lines BL or an interval between the bit lines BL may be determined according to a design rule.

A fourth direction DR4 may be orthogonal to the first direction DR1, the second direction DR2, and the third direction DR3. The fourth direction DR4 may be a thickness direction of the substrate 100.

The semiconductor memory device according to some example embodiments may include various contact arrangements formed on the cell active area ACT. Various contact arrangements may include, for example, a direct contact DC, a buried contact BC, and a landing pad LP.

Here, the direct contact DC may refer to a contact electrically connecting the cell active area ACT to the bit line BL. The buried contact BC may refer to a contact connecting the cell active area ACT to a lower electrode (191 in FIG. 3) of a capacitor. Due to an arrangement structure, a contact area between the buried contact BC and the cell active area ACT may be small. Accordingly, a conductive landing pad LP may be introduced to increase a contact area with the cell active area ACT and a contact area with the lower electrode (191 in FIG. 3) of the capacitor.

The landing pad LP may be disposed between the cell active area ACT and the buried contact BC, and may also be disposed between the buried contact BC and the lower electrode (191 in FIGS. 6 and 9) of the capacitor. In the semiconductor memory device according to some example embodiment, the landing pad LP may be disposed between the buried contact BC and the lower electrode (191 in FIG. 3) of the capacitor. By increasing the contact area through the introduction of the landing pad LP, contact resistance between the cell active area ACT and the lower electrode of the capacitor may be reduced.

The direct contact DC may be connected to the bit line connection portion 103a. The buried contact BC may be connected to the storage connection portion 103b. As the buried contact BC is disposed at both end portions of the cell active area ACT, the landing pad LP may be disposed to be adjacent to both ends of the cell active area ACT and partially overlap the buried contact BC. In other words, the buried contact BC may be formed to overlap the cell active area ACT and the cell element isolation layer (105 in FIGS. 3 and 4) between the word lines WL adjacent to each other and between the bit lines BL adjacent to each other.

The word line WL may be formed in a structure buried in the substrate 100. The word line WL may be disposed across the cell active area ACT between the direct contacts DC or between the buried contacts BC. As illustrated, two word lines WL may be disposed across one cell active area ACT. As the cell active area ACT extends along the third direction D3, the word line WL may have an angle of less than 90 degrees with the cell active area ACT.

The direct contact DC and the buried contact BC may be symmetrically disposed. Accordingly, the direct contact DC and the buried contact BC may be disposed on one straight line along the first direction D1 and the second direction D2. Meanwhile, unlike the direct contact DC and the buried contact BC, the landing pad LP may be disposed in a zigzag shape in the second direction D2 in which the bit line BL extends. In addition, the landing pad LP may be disposed to overlap the same side portion of each bit line BL in the first direction D1 in which the word line WL extends.

For example, each of the landing pads LP of a first line may overlap a left side of a corresponding bit line BL, and each of the landing pads LP of a second line may overlap a right side of a corresponding bit line BL.

Referring to FIGS. 1 to 7, the semiconductor memory device according to the example embodiment may include a plurality of cell gate structures 110, a plurality of bit line structures 140ST, a plurality of storage contacts 120, a plurality of bit line contacts 146, and an information storage portion 190.

The substrate 100 may be a silicon substrate or a silicon-on-insulator (SOI). Unlike this, the substrate 100 may include silicon germanium, silicon germanium on insulator (SGOI), indium antimonide, lead tellurium compound, indium arsenide, indium phosphide, gallium arsenide, or gallium antimonide, but is not limited thereto.

The cell element isolation layer 105 may be formed in the substrate 100. The cell element isolation layer 105 may have a shallow trench isolation (STI) structure having good element isolation characteristics. The cell element isolation layer 105 may define the cell active area ACT in a memory cell area.

The cell active area ACT defined by the cell element isolation layer 105 may have a long island shape including a short axis and a long axis as illustrated in FIGS. 1 and 2. The cell active area ACT may have an oblique shape to have an angle of less than 90 degrees with respect to the word line WL formed in the cell element isolation layer 105. In addition, the cell active area ACT may have an oblique shape to have an angle of less than 90 degrees with respect to the bit line BL formed on the cell element isolation layer 105.

The cell element isolation layer 105 may include, for example, at least one of a silicon oxide layer, a silicon nitride layer, or a silicon oxynitride layer, but is not limited thereto.

The cell element isolation layer 105 is illustrated as being formed as a single insulating layer, but it is only for convenience of explanation and the present disclosure is not limited thereto. The cell element isolation layer 105 may be formed as a single insulating layer or a plurality of insulating layers according to a spaced distance between the cell active areas ACT to each other.

In FIG. 3, an upper surface 105US of the cell element isolation layer and an upper surface of the substrate 100 are illustrated as being on the same plane, but this is only for convenience of explanation and the present disclosure is not limited thereto. For reasons of manufacturing process, a height level of the upper surface 105US of the cell element isolation layer illustrated in FIG. 3 may be different from a height level of the upper surface of the cell element isolation layer 105 illustrated in FIG. 4. Hereinafter, it will be described that the upper surface 105US of the cell element isolation layer illustrated in the cross-sectional view cut as illustrated in FIG. 3 is the upper surface of the cell element isolation layer illustrated in FIG. 4.

The cell gate structure 110 is formed in the substrate 100 and the cell element isolation layer 105. The cell gate structure 110 may be formed across the cell element isolation layer 105 and the cell active area ACT defined by the cell element isolation layer 105.

The cell gate structure 110 is formed in the substrate 100 and the cell element isolation layer 105. The cell gate structure 110 may include a cell gate trench 115, a cell gate insulating layer 111, a cell gate electrode 112, a cell gate capping pattern 113, and a cell gate capping conductive layer 114.

Here, the cell gate electrode 112 may correspond to the word line WL. For example, the cell gate electrode 112 may be the word line WL of FIG. 1. Unlike illustrated, the cell gate structure 110 may not include the cell gate capping conductive layer 114.

Although not illustrated, the cell gate trench 115 may be relatively deep in the cell element isolation layer 105 and relatively shallow in the cell active areas ACT. A bottom surface of the word line WL may be curved. That is, a depth of the cell gate trench 115 in the cell element isolation layer 105 may be greater than a depth of the cell gate trench 115 in the cell active area ACT.

The cell gate insulating layer 111 may extend along a sidewall and a bottom surface of the cell gate trench 115. The cell gate insulating layer 111 may extend along a profile of at least a portion of the cell gate trench 115.

The cell gate insulating layer 111 may include, for example, at least one of silicon oxide, silicon nitride, silicon oxynitride, or a high-k material having a dielectric constant higher than that of silicon oxide. The high-k material may include, for example, at least one of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof.

The cell gate electrode 112 may be disposed on the cell gate insulating layer 111. The cell gate electrode 112 may fill a portion of the cell gate trench 115. The cell gate capping conductive layer 114 may extend along an upper surface of the cell gate electrode 112.

The cell gate electrode 112 may include at least one of a metal, a metal alloy, conductive metal nitride, conductive metal carbonitride, conductive metal carbide, metal silicide, a doped semiconductor material, conductive metal oxynitride, or conductive metal oxide. The cell gate electrode 112 may include, for example, at least one of TiN, TaC, TaN, TiSiN, TaSiN, TaTiN, TiAlN, TaAlN, WN, Ru, TiAl, TiAlC—N, TiAlC, TiC, TaCN, W, Al, Cu, Co, Ti, Ta, Ni, Pt, Ni—Pt, Nb, NbN, NbC, Mo, MoN, MoC, WC, Rh, Pd, Ir, Ag, Au, Zn, V, RuTiN, TiSi, TaSi, NiSi, CoSi, IrOx, RuOx, or a combination thereof, but is not limited thereto.

The cell gate capping conductive layer 114 may include, for example, one of polysilicon, polysilicon-germanium, amorphous silicon, or amorphous silicon-germanium, but is not limited thereto.

The cell gate capping pattern 113 may be disposed on the cell gate electrode 112 and the cell gate capping conductive layer 114. The cell gate capping pattern 113 may fill the cell gate trench 115 remaining after the cell gate electrode 112 and the cell gate capping conductive layer 114 are formed. The cell gate insulating layer 111 is illustrated as extending along sidewalls of the cell gate capping pattern 113, but is not limited thereto.

The cell gate capping pattern 113 may include, for example, at least one of silicon nitride (SiN), silicon oxynitride (SiON), silicon oxide (SiO$_2$), silicon carbonitride (SiCN), silicon oxycarbonitride (SiOCN), or a combination thereof.

In FIG. 4, an upper surface of the cell gate capping pattern 113 is illustrated as being on the same plane as the upper surface of the cell element isolation layer 105, but is not limited thereto.

Although not illustrated, an impurity doped area may be formed on at least one side of the cell gate structure 110. The impurity doped area may be a source/drain area of a transistor. The impurity doped area may be formed in the storage connection portion 103b and the bit line connection portion 103a of FIG. 2.

In FIG. 2, when the transistor including each word line WL and the bit line connection portion 103a and the storage connection portion 103b adjacent thereto is an n-channel metal oxide semiconductor (NMOS), the storage connection portion 103b and the bit line connection portion 103a may include at least one of doped n-type impurities, for example, phosphorus (P), arsenic (As), antimony (Sb), or bismuth (Bi). When the transistor including each word line WL and the bit line connection portion 103a and the storage connection portion 103b adjacent thereto is a p-channel metal oxide semiconductor (PMOS), the storage connection portion 103b and the bit line connection portion 103a may include doped p-type impurities, for example, boron (B)

The bit line structure 140ST may include a cell conductive line 140, a cell line capping layer 144, and a bit line spacer 150.

The cell conductive line 140 may be disposed on the substrate 100 and the cell element isolation layer 105 in which the cell gate structure 110 is formed. The cell conductive line 140 may intersect the cell element isolation layer 105 and the cell active area ACT defined by the cell element isolation layer 105. The cell conductive line 140 may be formed to intersect the cell gate structure 110. Here, the cell conductive line 140 may correspond to the bit line BL. For example, the cell conductive line 140 may be the bit line BL of FIG. 1.

The cell conductive line 140 may include, for example, at least one of a semiconductor material doped with impurities, a conductive silicide compound, conductive metal nitride, a two-dimensional (2D) material, a metal, or a metal alloy. In the semiconductor memory device according to some example embodiment, the 2D material may be a metallic material and/or a semiconductor material. The 2D material may include a two-dimensional allotrope or a two-dimensional compound, and may include, for example, at least one of graphene, molybdenum disulfide ($MoS_2$), molybdenum diselenide ($MoSe_2$), tungsten diselenide ($WSe_2$), or tungsten disulfide ($WS_2$), but is not limited thereto. That is, because the above-described 2D material is only listed as an example, the 2D material that may be included in the semiconductor memory device of the present disclosure is not limited by the above-described material.

The cell conductive line 140 is illustrated as a single layer, but it is only for convenience of explanation and the present disclosure is not limited thereto. That is, unlike illustrated, the cell conductive line 140 may include a plurality of conductive layers on which a conductive material is stacked.

The cell line capping layer 144 may be disposed on the cell conductive line 140. The cell line capping layer 144 may extend in the second direction DR2 along the upper surface of the cell conductive line 140. The cell line capping layer 144 may include, for example, at least one of a silicon nitride layer, silicon oxynitride, silicon carbonitride, or silicon oxycarbonitride.

In the semiconductor memory device according to some example embodiments, the cell line capping layer 144 may include a silicon nitride layer. The cell line capping layer 144 is illustrated as a single layer, but is not limited thereto.

The bit line spacer 150 may be disposed on sidewalls of the cell conductive line 140 and the cell line capping layer 144. The bit line spacer 150 extends in the second direction DR2.

The bit line spacer 150 is illustrated as a single layer, but it is only for convenience of explanation and the present disclosure is not limited thereto. That is, unlike illustrated, the bit line spacer 150 may also have a multilayer structure. The bit line spacer 150 may include, for example, one of a silicon oxide layer, a silicon nitride layer, a silicon oxynitride layer (SiON), a silicon oxycarbonitride layer (SiOCN), air, or a combination thereof, but is not limited thereto.

The cell insulating layer 130 may be formed on the substrate 100 and the cell element isolation layer 105. For example, the cell insulating layer 130 may be formed on the substrate 100 on which the bit line contact 146 and the storage contact 120 are not formed and on the upper surface 105US of the cell element isolation layer. The cell insulating layer 130 also may be disposed between the substrate 100 and the cell conductive line 140 and between the cell element isolation layer 105 and the cell conductive line 140.

The cell insulating layer 130 may be a single layer, but as illustrated, the cell insulating layer 130 may also be multiple layers including a first cell insulating layer 131 and a second cell insulating layer 132. For example, the first cell insulating layer 131 may include a silicon oxide layer, and the second cell insulating layer 132 may include a silicon nitride layer, but the present disclosure is not limited thereto. Unlike illustrated, the cell insulating layer 130 may be a triple layer including a silicon oxide layer, a silicon nitride layer, and a silicon oxide layer, but is not limited thereto.

The bit line contact 146 may be formed between the cell conductive line 140 and the substrate 100. The cell conductive line 140 may be disposed on the bit line contact 146.

The bit line contact 146 may be formed between the bit line connection portion 103a of the cell active area ACT and the cell conductive line 140. The bit line contact 146 may electrically connect the cell conductive line 140 and the substrate 100 to each other. The bit line contact 146 may be connected to the bit line connection portion 103a.

The bit line contact 146 may include an upper surface connected to the cell conductive line 140. A width of the bit line contact 146 in the first direction DR1 is illustrated as being constant as a distance from the upper surface of the bit line contact 146 increases, but this is only for convenience of explanation, and the present disclosure is not limited thereto.

The bit line contact 146 may correspond to the direct contact DC. The bit line contact 146 may include, for example, at least one of a semiconductor material doped with impurities, conductive metal silicide, conductive metal nitride, conductive metal oxide, a metal, or a metal alloy.

In the portion of the cell conductive line 140 on which the bit line contact 146 is formed, the bit line spacer 150 may be formed on the substrate 100 and the cell element isolation layer 105. The bit line spacer 150 may be disposed on sidewalls of the cell conductive line 140, the cell line capping layer 144, and the bit line contact 146.

In the remaining portion of the cell conductive line 140 on which the bit line contact 146 is not formed, the bit line spacer 150 may be disposed on the cell insulating layer 130. The bit line spacer 150 may be disposed on the sidewalls of the cell conductive line 140 and the cell line capping layer 144.

A fence pattern 170 may be disposed on the substrate 100 and the cell element isolation layer 105. The fence pattern 170 may be formed to overlap the cell gate structure 110 formed in the substrate 100 and the cell element isolation layer 105.

The fence pattern 170 may be disposed between the bit line structures 140ST extending in the second direction D2. The fence pattern 170 may include, for example, at least one of silicon oxide, silicon nitride, silicon oxynitride, or a combination thereof.

The storage contact 120 may be disposed between the cell conductive lines 140 adjacent to each other in the first direction D1. The storage contact 120 may be disposed on each of both sides of the cell conductive line 140. For example, the storage contact 120 may be disposed between the bit line structures 140ST. The storage contact 120 may be disposed between the fence patterns 170 adjacent to each other in the second direction D2.

The storage contact 120 may overlap the substrate 100 and the cell element isolation layer 105 between the cell conductive lines 140 adjacent to each other. The storage contact 120 may be connected to the cell active area ACT. For example, the storage contact 120 may be connected to the storage connection portion 103b. Here, the storage contact 120 may correspond to the buried contact BC of FIG. 1.

The storage contact 120 includes a lower storage contact 121 and an upper storage contact 122. The lower storage contact 121 is directly connected to the upper storage contact 122.

The lower storage contact 121 is directly connected to the substrate 100. The lower storage contact 121 is connected to the storage connection portion 103b. At least a portion of the lower storage contact 121 is disposed in the substrate 100.

A lower storage contact 121 is disposed in a storage contact recess 120R. The lower storage contact 121 may fill an entire storage contact recess 120R.

In FIG. 3, the storage contact recess 120R may be defined by the substrate 100, the cell element isolation layer 105, and the bit line spacer 150. Because a portion of the storage contact recess 120R is defined by the bit line spacer 150, the lower storage contact 121 may be disposed on the bit line spacer 150. The lower storage contact 121 is in contact with the substrate 100, the cell element isolation layer 105, and the bit line spacer 150.

In the semiconductor memory device according to some example embodiments, an upper surface 121US of the lower storage contact may be a flat surface. Here, the upper surface 121US of the lower storage contact may have a shape illustrated in a cross-sectional view as illustrated in FIG. 3.

In the semiconductor memory device according to some example embodiments, the upper surface 121US of the lower storage contact may be higher than or equal to the upper surface 105US of the cell element isolation layer.

In FIG. 5, the upper surface 121US of the lower storage contact may be on the same plane as the upper surface 105US of the cell element isolation layer. Based on the lowermost portion of the bit line spacer 150, the upper surface 121US of the lower storage contact may be positioned at the same height as the upper surface 105US of the cell element isolation layer.

In FIG. 6, based on the lowermost portion of the bit line spacer 150, the upper surface 121US of the lower storage contact may be higher than the upper surface 105US of the cell element isolation layer.

The upper storage contact 122 is disposed on the lower storage contact 121. The upper storage contact 122 is directly connected to the lower storage contact 121.

A lower surface 122BS of the upper storage contact is connected to the upper surface 121US of the lower storage contact. The storage contact 120 includes an interface 120_IF at which the lower surface 122BS of the upper storage contact and the upper surface 121US of the lower storage contact are connected.

The entire upper surface 121US of the lower storage contact is in contact with the entire lower surface 122BS of the upper storage contact.

In other words, a width W11 of the upper surface 121US of the lower storage contact in the first direction DR1 is the same as a width W12 of the lower surface 122BS of the upper storage contact in the first direction DR1. In addition, a width W13 of the interface 120_IF of the storage contact in the first direction DR1 is the same as the width W11 of the upper surface 121US of the lower storage contact in the first direction DR1. The width W13 of the interface 120_IF of the storage contact in the first direction DR1 is the same as the width W12 of the lower surface 122BS of the upper storage contact in the first direction DR1.

The bit line spacer 150 does not cover the upper surface 121US of the lower storage contact. That is, the entire upper surface 121US of the lower storage contact is covered by the upper storage contact 122.

The bit line spacer 150 does not extend along the upper surface 121US of the lower storage contact. The bit line spacer 150 does not include a portion spanning the upper surface 121US of the lower storage contact. The entire upper surface 121US of the lower storage contact is not in contact with the bit line spacer 150.

The lower storage contact 121 includes a semiconductor material. The lower storage contact 121 includes a semiconductor epitaxial pattern formed using an epitaxial growth method.

The upper storage contact 122 includes a semiconductor material. The upper storage contact 122 may include one of a polycrystalline semiconductor material, an amorphous semiconductor material, or a single crystal semiconductor material.

As an example, the lower storage contact 121 may include an undoped semiconductor material. The upper storage contact 122 may include an n-type impurity. Here, the "undoped semiconductor material" refers to a semiconductor material that does not include intentionally implanted or doped impurities. That is, when the semiconductor material is grown, the undoped semiconductor material refers to a semiconductor material in which p-type impurities or n-type impurities are not intentionally implanted into the semiconductor layer. However, the undoped semiconductor material may include impurities that have diffused from an adjacent layer.

As another example, each of the lower storage contact 121 and the upper storage contact 122 may include an n-type impurity. A concentration ($/cm^3$) of the n-type impurity in the upper storage contact 122 is greater than a concentration ($/cm^3$) of the n-type impurity in the lower storage contact 121.

The storage contact 120 may further include an impurity pile-up area 120_IPR. The impurity pile-up area 120_IPR is formed in the storage contact 120.

The impurity pile-up area 120_IPR may be formed near the interface 120_IF between the upper storage contact 122 and the lower storage contact 121. The impurity pile-up area 120_IPR may be formed along the interface 120_IF of the storage contact.

The impurity pile-up area 120_IPR may be an area in which more pile-up impurities are piled up than other areas of the storage contact 120. The impurity pile-up area 120_IPR may be an area in which the pile-up impurities are piled up.

FIG. 7 does not mean that an area of the storage contact 120 other than the impurity file-up area 120_IPR does not include the file-up impurities. The pile-up impurities may include, for example, at least one of carbon or nitrogen, but is not limited thereto.

In this case, the pile-up impurities piled up in the impurity pile-up area 120_IPR may include, for example, at least one of carbon or nitrogen.

In FIG. 7, the file-up impurity may rapidly increase at the interface 120_IF of the storage contact. In addition, a concentration of the pile-up impurity in the lower storage contact 121 may gradually decrease as a distance from the interface 120_IF of the storage contact increases.

A boundary between the lower storage contact 121 and the upper storage contact 122 is illustrated as being distinguished, but the present disclosure is not limited thereto. Unlike illustrated, the boundary between the lower storage contact 121 and the upper storage contact 122 may not be distinguished.

However, because the impurity pile-up area 120_IPR may be identified through component analysis, the interface 120_IF between the lower storage contact 121 and the upper storage contact 122 may be identified through the impurity pile-up area 120_IPR.

A storage pad 160 may be formed on the storage contact 120. The storage pad 160 may be electrically connected to the storage contact 120. The storage pad 160 may be connected to the storage connection portion 103*b* of the cell active area ACT. Here, the storage pad 160 may correspond to the landing pad LP.

The storage pad 160 may overlap a portion of the upper surface of the bit line structure 140ST. The storage pad 160 may include, for example, at least one of conductive metal nitride, conductive metal carbide, a metal, or a metal alloy.

A contact silicide layer 161 is disposed between the storage pad 160 and the storage contact 120. The contact silicide layer 161 may include a metal silicide compound.

A pad isolation insulating layer 180 may be formed on the storage pad 160 and the bit line structure 140ST. For example, the pad isolation insulating layer 180 may be disposed on the cell line capping layer 144. The pad isolation insulating layer 180 may define the storage pad 160. The pad isolation insulating layer 180 does not cover an upper surface 160US of the storage pad. For example, based on the upper surface of the substrate 100, a height of the upper surface 160US of the storage pad may be the same as a height of an upper surface of the pad isolation insulating layer 180.

The pad isolation insulating layer 180 may include an insulating material and may electrically isolate the plurality of storage pads 160 from each other. For example, the pad isolation insulating layer 180 may include, for example, at least one of a silicon oxide layer, a silicon nitride layer, a silicon oxynitride layer, a silicon oxycarbonitride layer, or a silicon carbonitride layer.

An etching stop layer 165 may be disposed on the upper surface 160US of the storage pad and the upper surface of the pad isolation insulating layer 180. The etching stop layer 165 may include, for example, at least one of silicon nitride (SiN), silicon carbonitride (SiCN), silicon oxycarbonitride (SiOCN), silicon oxycarbide (SiOC), or silicon boron nitride (SiBN).

The information storage portion 190 may be disposed on the storage pad 160. The information storage portion 190 is connected to the storage pad 160. A portion of the information storage portion 190 may be disposed in the etching stop layer 165.

The information storage portion 190 may include, for example, a capacitor, but is not limited thereto. The information storage portion 190 includes a lower electrode 191, a capacitor dielectric layer 192, and an upper electrode 193. For example, the upper electrode 193 may be a plate upper electrode having a plate shape.

The lower electrode 191 may be disposed on the storage pad 160. The lower electrode 191 may have a pillar shape, for example.

The capacitor dielectric layer 192 is formed on the lower electrode 191. The capacitor dielectric layer 192 may be formed along a profile of the lower electrode 191. The upper electrode 193 is formed on the capacitor dielectric layer 192. The upper electrode 193 may surround an outer sidewall of the lower electrode 191. The upper electrode 193 is illustrated as being a single layer, but this is only for convenience of explanation and the present disclosure is not limited thereto.

Each of the lower electrode 191 and the upper electrode 193 may include, for example, a doped semiconductor material, conductive metal nitride (e.g., titanium nitride, tantalum nitride, niobium nitride, or tungsten nitride), a metal (e.g., ruthenium, iridium, titanium, or tantalum), conductive metal oxide (e.g., iridium oxide or niobium oxide), and the like, but is not limited thereto.

The capacitor dielectric layer 192 may include, for example, one of silicon oxide, silicon nitride, silicon oxynitride, a high-k material, or a combination thereof, but is not limited thereto. In the semiconductor memory device according to some example embodiments, the capacitor dielectric layer 192 may include a stacked layer structure in which zirconium oxide, aluminum oxide, or zirconium oxide are sequentially stacked. In the semiconductor memory device according to some example embodiments, the capacitor dielectric layer 192 may include a dielectric layer including hafnium (Hf). In the semiconductor memory device according to some example embodiments, the capacitor dielectric layer 192 may have a stacked layer structure of a ferroelectric material layer and a paraelectric material layer.

Figure 8:
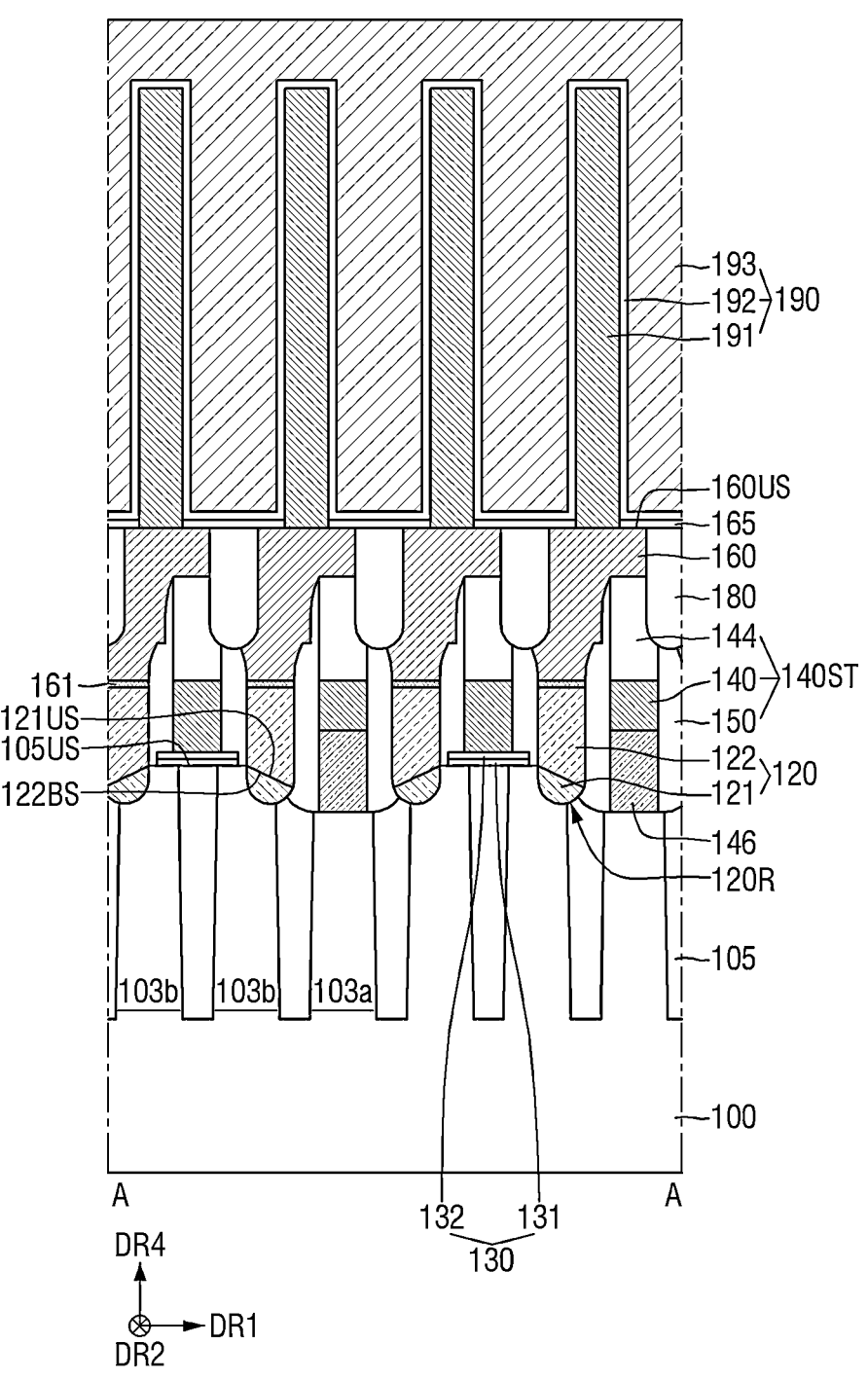
FIG. 8 is a view for describing a semiconductor memory device according to an example embodiment.
Figure 9:
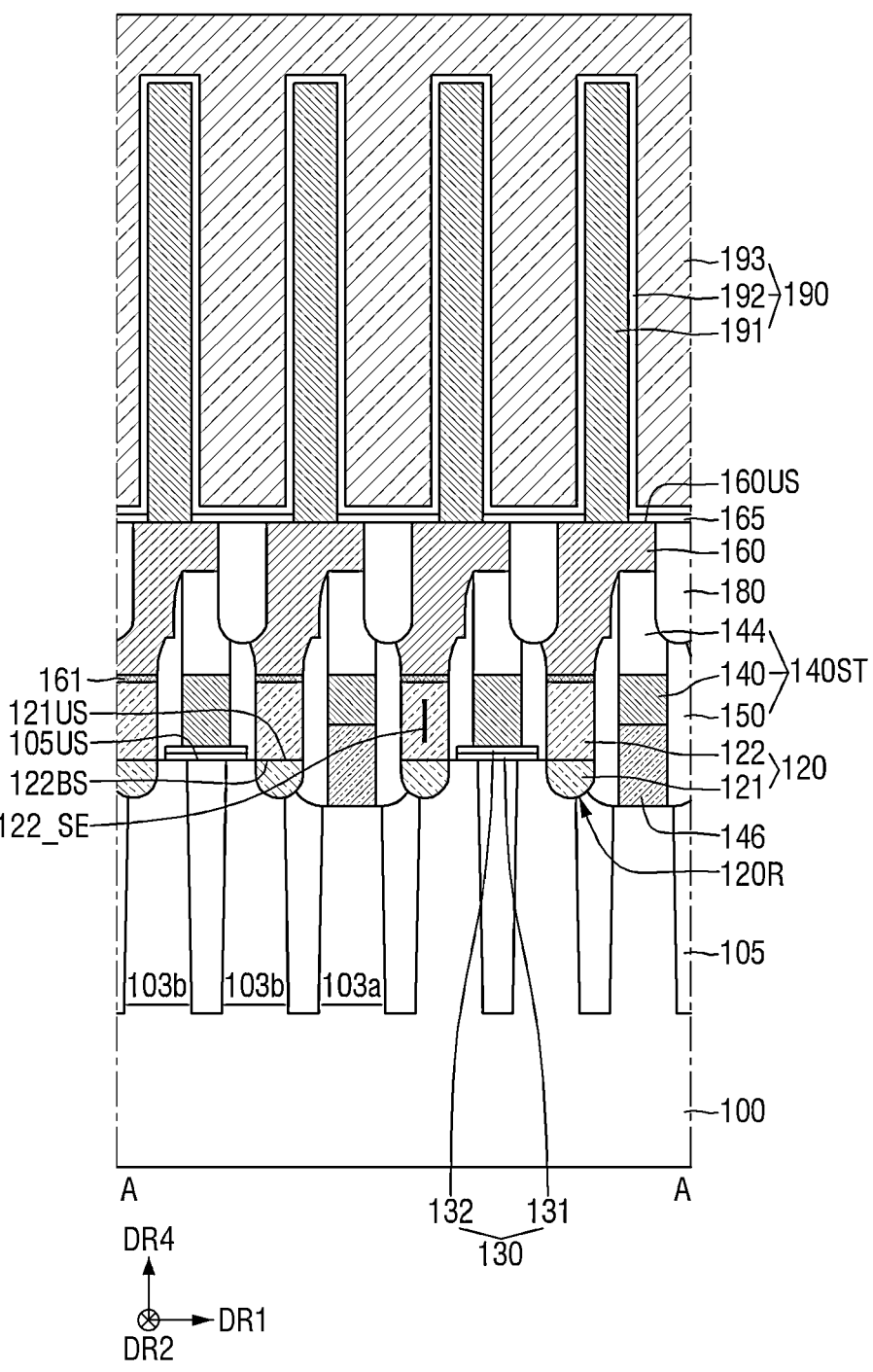
FIG. 9 is a view for describing a semiconductor memory device according to an example embodiment.
Figure 10:
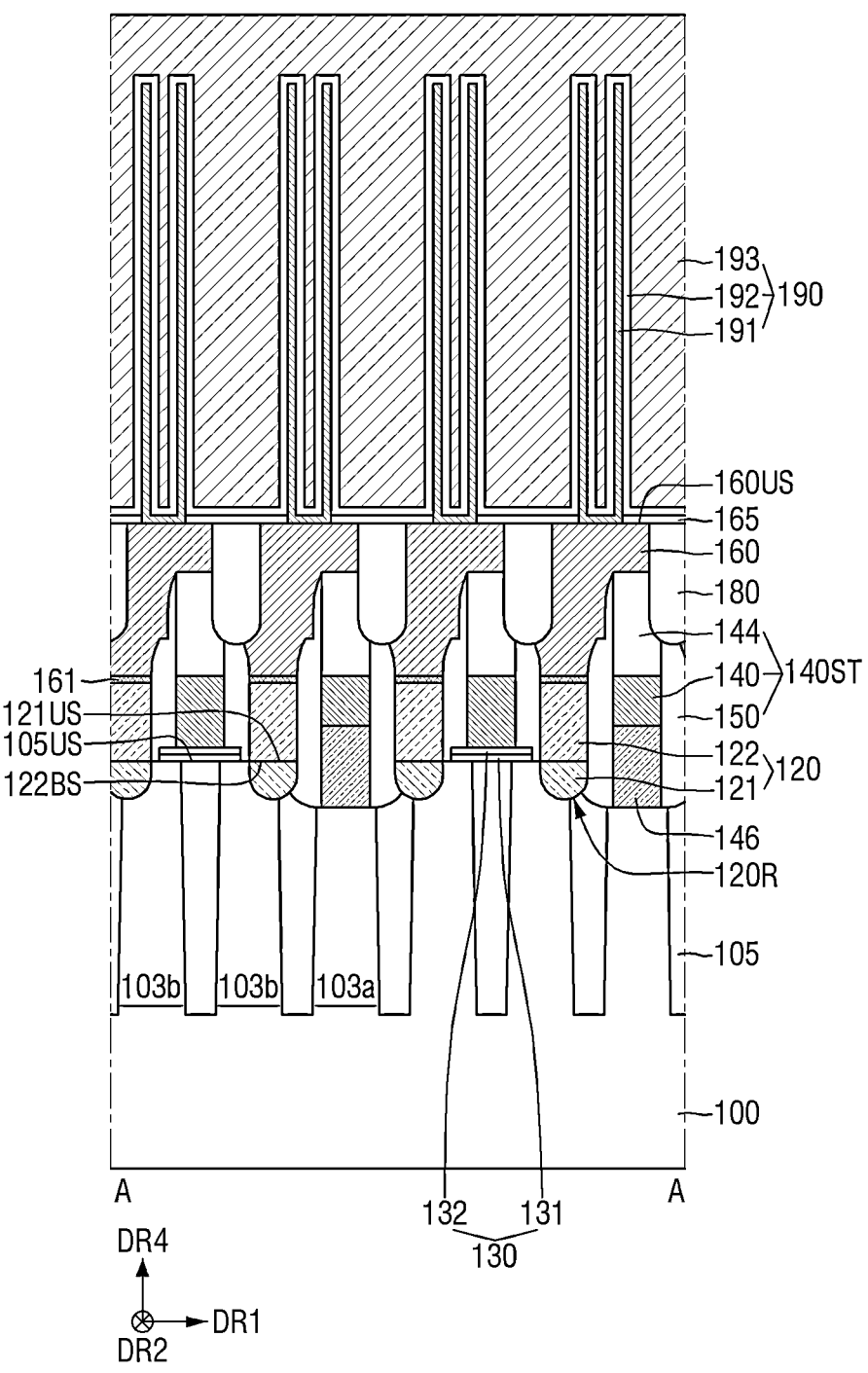
FIG. 10 is a view for describing a semiconductor memory device according to an example embodiment.
Figure 11:
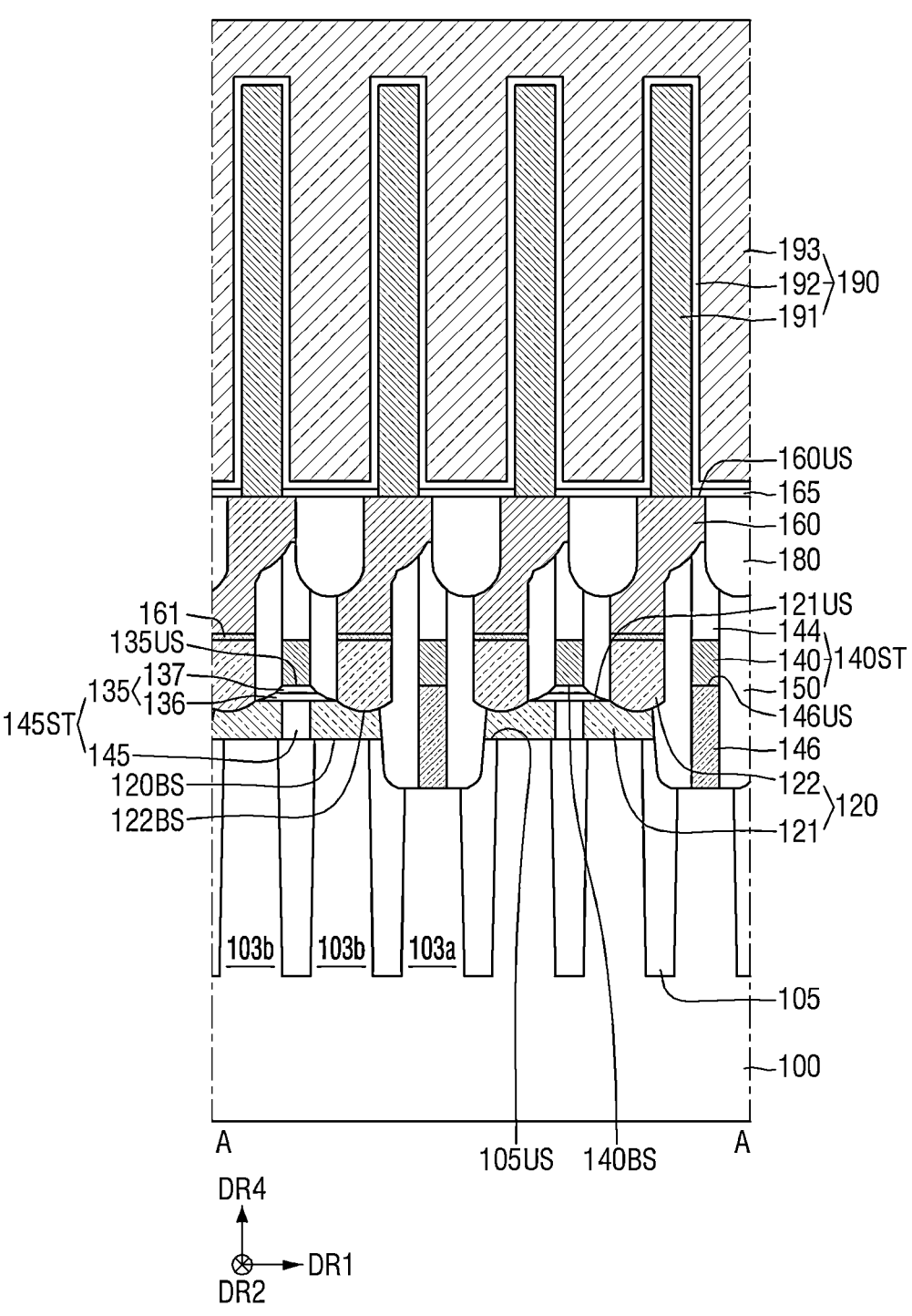
FIG. 11 is a view for describing a semiconductor memory device according to an example embodiment.

FIG. 8 is a view for describing a semiconductor memory device according to an example embodiment. FIG. 9 is a view for describing a semiconductor memory device according to an example embodiment. FIG. 10 is a view for describing a semiconductor memory device according to an example embodiment. FIG. 11 is a view for describing a semiconductor memory device according to an example embodiment. For convenience of explanation, points different from those described with reference to FIGS. 1 to 7 will be mainly described.

Referring to FIG. 8, in the semiconductor memory device according to an example embodiment, the upper surface 121US of the lower storage contact may be an inclined plane in a cross-sectional view.

The upper surface 121US of the lower storage contact may be an inclined surface inclined downwardly toward the bit line contact 146.

The storage contact recess 120R may include a first portion defined by the substrate 100 and a second portion defined by the cell element isolation layer 105 and the bit line spacer 150. A height of the upper surface 121US of the lower storage contact overlapping the first portion of the storage contact recess 120R in the fourth direction DR4 is higher than the upper surface 121US of the lower storage contact overlapping the second portion of the storage contact recess 120R in the fourth direction DR4.

Referring to FIG. 9, in the semiconductor memory device according to an example embodiment, the upper storage contact 122 may further include a seam pattern 122_SE.

In some of the plurality of storage contacts 120, the upper storage contact 122 may include the seam pattern 122_SE. In the remainder of the plurality of storage contacts 120, the upper storage contact 122 does not include the seam pattern 122_SE.

Unlike illustrated, in each storage contact 120, the upper storage contact 122 may include the seam pattern 122_SE.

Referring to FIG. 10, in the semiconductor memory device according to an example embodiment, the lower electrode 191 may have a cylindrical shape.

The lower electrode 191 may include a bottom portion extending along the upper surface 160US of the storage pad and a sidewall portion extending from the bottom portion in the fourth direction DR4.

Referring to FIG. 11, in the semiconductor memory device according to an example embodiment, the storage contact 120 may be disposed on the substrate 100 and the cell element isolation layer 105.

The storage contact 120 may be disposed on the upper surface 105US of the cell element isolation layer. A lower surface 120BS of the storage contact may be disposed on the upper surface 105US of the cell element isolation layer. The lower surface 120BS of the storage contact may be a lower surface of the lower storage pad 121. The lower storage pad 121 may be in contact with the upper surface 105US of the cell element isolation layer. In the semiconductor memory device according to some example embodiments, the entire lower storage pad 121 may be disposed on the upper surface of the substrate 100.

Based on the upper surface 105US of the cell element isolation layer, an upper surface 121US of the lower storage pad may be lower than an upper surface 146US of the bit line contact. Based on the upper surface 105US of the cell element isolation layer, the upper surface 121US of the lower storage pad may be lower than a lower surface 140BS of the cell conductive line.

A contact isolation structure 145ST may isolate the lower storage contacts 121 adjacent to each other in the first direction DR1. Although not illustrated, the contact isolation structure 145ST may isolate the lower storage contacts 121 adjacent to each other in the second direction DR2. The contact isolation structure 145ST covers the upper surface 121US of the lower storage contact.

The contact isolation structure 145ST may include a contact isolation pattern 145 and an upper cell insulating layer 135. The upper cell insulating layer 135 may be disposed on the contact isolation pattern 145.

When the lower storage contact 121 includes a first lower storage contact and a second lower storage contact spaced apart from each other in the first direction DR1, the contact isolation pattern 145 may isolate the first lower storage contact and the second lower storage contact from each other in the first direction DR1. Although not illustrated, the contact isolation pattern 145 may also isolate the lower storage contacts 121 adjacent to each other in the second direction DR2.

The entire upper surface 121US of the lower storage contact may not be in contact with the entire lower surface 122BS of the upper storage contact. In other words, a width of an interface between the lower storage contact 121 and the upper storage contact 122 in the first direction DR1 may be smaller than a width of the upper surface 121US of the lower storage contact in the first direction DR1. The width of the interface between the lower storage contact 121 and the upper storage contact 122 in the first direction DR1 may be smaller than a width of the lower surface 122BS of the upper storage contact in the first direction DR1.

The bit line spacer 150 may be disposed on the upper surface 121US of the lower storage contact.

The upper cell insulating layer 135 covers the upper surface 121US of the lower storage contact. When the lower storage contact 121 includes the first lower storage contact and the second lower storage contact spaced apart from each other in the first direction DR1, the upper cell insulating layer 135 may cover an upper surface of the first lower storage contact and an upper surface of the second lower storage contact.

The upper surface 135US of the upper cell insulating layer may be on the same plane as the upper surface 146US of the bit line contact. That is, based on the upper surface 105US of the cell element isolation layer, a height of the upper surface 135US of the upper cell insulating layer may be the same as a height of the upper surface 146US of the bit line contact.

The contact isolation pattern 145 and the upper cell insulating layer 135 may be disposed between the bit line contacts 146 adjacent to each other in the first direction DR1. The cell conductive line 140 may be disposed on the upper surface of the contact isolation structure 145ST. The cell conductive line 140 may be disposed on the upper surface 135US of the upper cell insulating layer. The upper surface of the contact isolation structure 145ST may be the upper surface 135US of the upper cell insulating layer. The upper surface of the contact isolation structure 145ST may be on the same plane as the lower surface 140BS of the cell conductive line.

The contact isolation pattern 145 may include, for example, at least one of silicon nitride (SiN), silicon oxynitride (SiON), silicon oxide ($SiO_2$), silicon carbonitride (SiCN), silicon oxycarbonitride (SiOCN), or a combination thereof. The upper cell insulating layer 135 may be a single layer, but as illustrated, the upper cell insulating layer 135 may be a multilayer including a first upper cell insulating layer 136 and a second upper cell insulating layer 137. For example, the first upper cell insulating layer 136 may include a silicon oxide layer, and the second upper cell insulating layer 137 may include a silicon nitride layer, but the present disclosure is not limited thereto. A width of the upper cell insulating layer 135 in the first direction DR1 is illustrated as decreasing as a distance from the substrate 100 increases, but the present disclosure is not limited thereto.

FIGS. 12 to 22 are intermediate step views for describing a method for fabricating a semiconductor memory device according to an example embodiment. Among the descriptions of the fabricating method, the contents overlapping those described with reference to FIGS. 1 to 11 will be briefly described or omitted.

Figure 12:
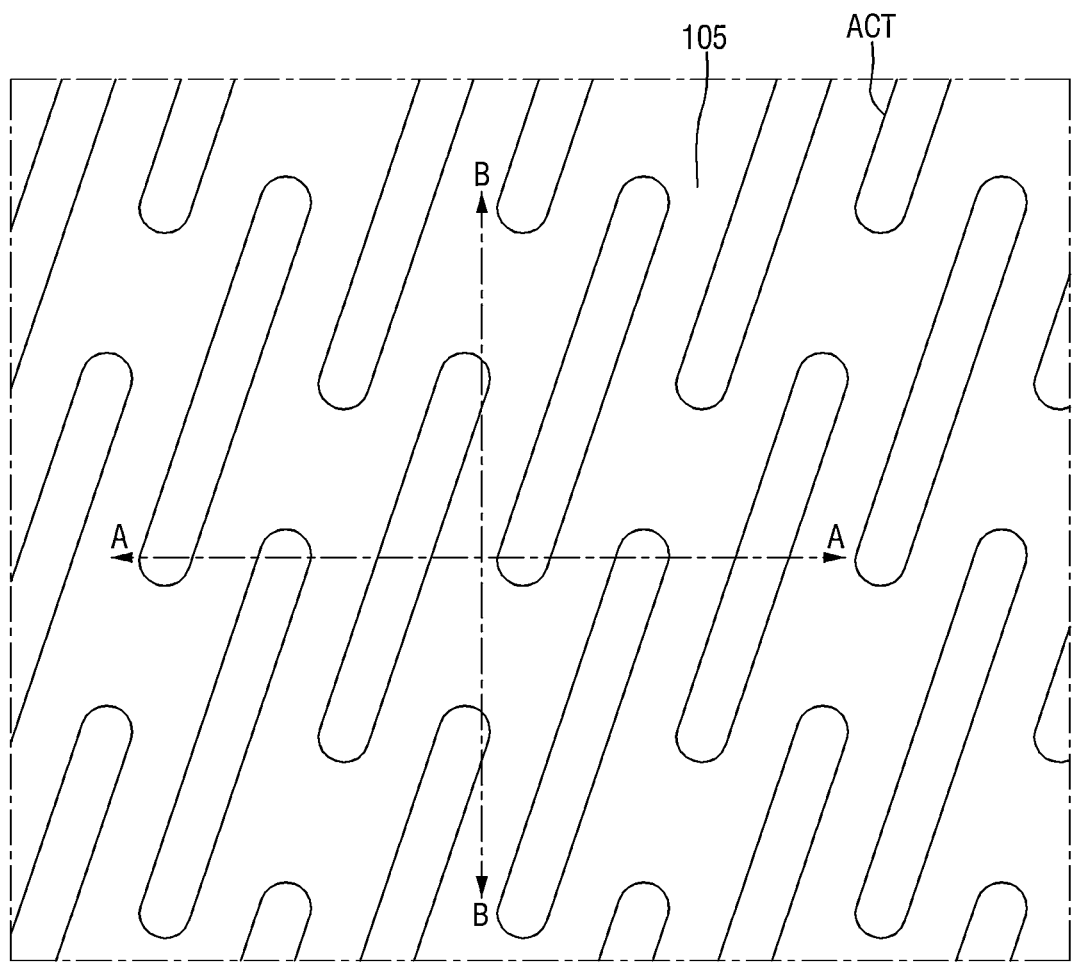
Figure 12:
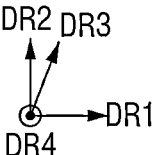

Referring to FIG. 12, a cell element isolation layer 105 may be formed in a substrate 100.

The substrate 100 may include a cell active area ACT defined by the cell element isolation layer 105. The cell active area ACT may have a bar shape extending in a third direction DR3.

Subsequent fabricating processes will be described using cross-sectional views taken along lines A-A and B-B of FIG. 12.

Figure 13:
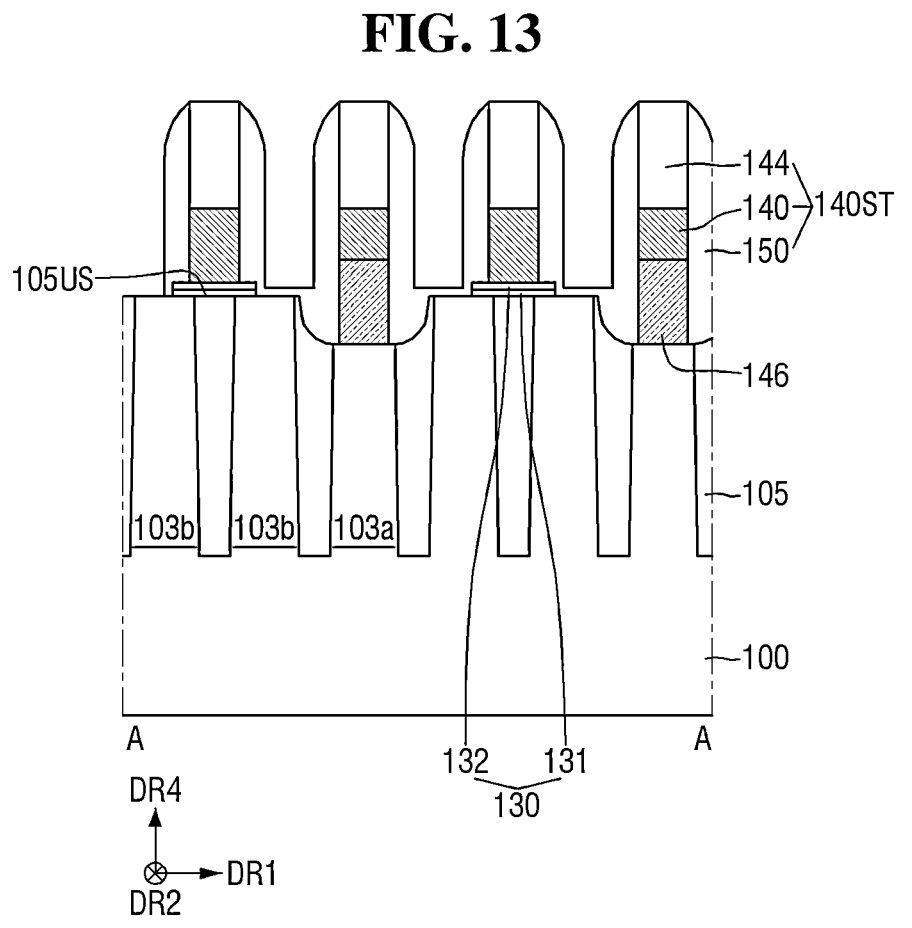
Figure 14:
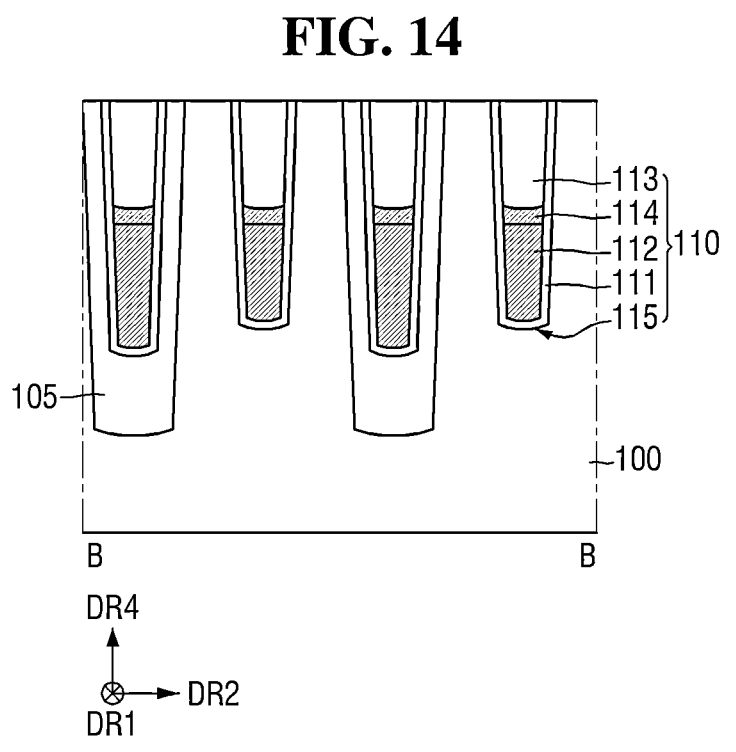

Referring to FIGS. 13 and 14, a cell gate electrode 112 is formed in the substrate 100 and the cell element isolation layer 105.

The cell gate electrode 112 may extend to be long in a first direction DR1. The cell gate electrodes 112 may be spaced apart from each other in a second direction DR2.

For example, a cell gate structure 110 extending in the first direction DR1 is formed in the substrate 100 and the cell element isolation layer 105. The cell gate structure 110 may include a cell gate trench 115, a cell gate insulating layer 111, a cell gate electrode 112, a cell gate capping pattern 113, and a cell gate capping conductive layer 114.

The cell gate electrode 112 intersects the cell active area (ACT in FIG. 12). By the cell gate electrode 112, the cell active area ACT may be divided into a bit line connection portion 103a and a storage connection portion 103b.

The cell active area ACT includes a bit line connection portion 103a positioned at a central portion of the cell active area ACT and a storage connection portion 103b positioned at an end portion of the cell active area ACT.

Subsequently, a cell conductive line 140 is formed on the substrate 100 and the cell element isolation layer 105.

The cell conductive line 140 may extend in the second direction D2. The cell conductive lines 140 may be spaced apart from each other in the first direction DR1.

For example, a bit line structure 140ST extending in the second direction DR2 is formed in the substrate 100 and the cell element isolation layer 105. The bit line structure 140ST may include a cell conductive line 140, a cell line capping layer 144, and a bit line spacer 150. The bit line structures 140ST adjacent to each other in the first direction DR1 may be connected to each other by a portion of the bit line spacer 150.

While the bit line structure 140ST is formed, a bit line contact 146 is also formed.

Figure 15:
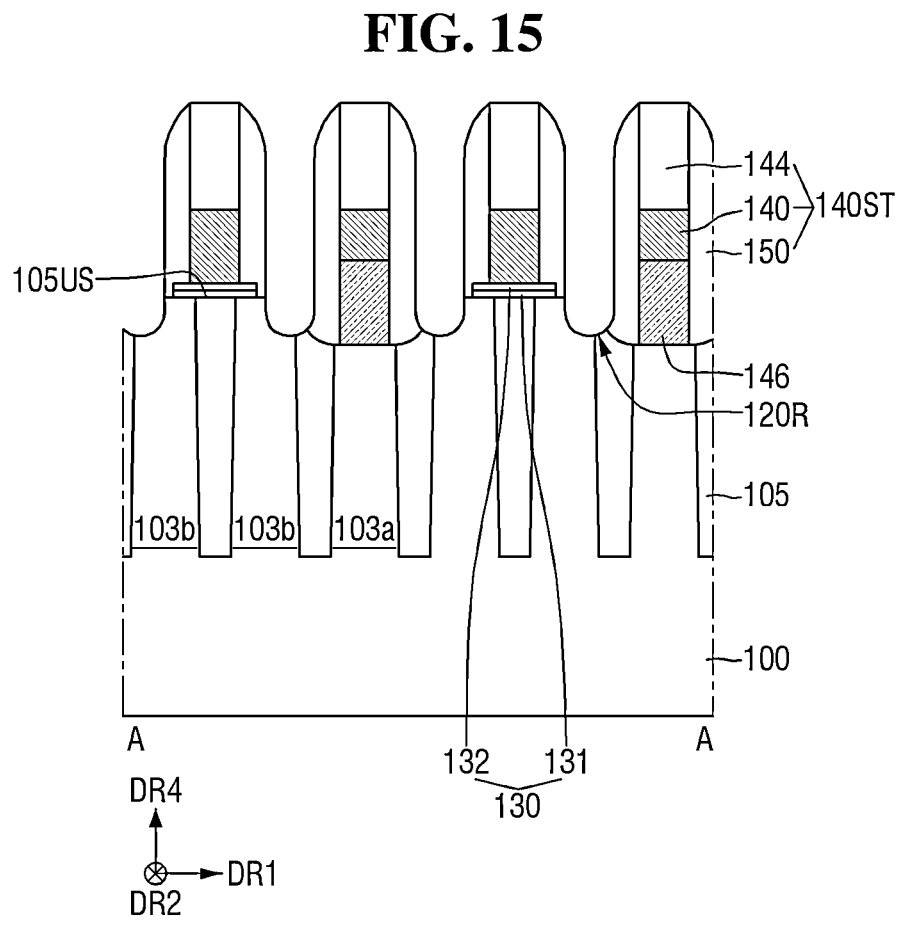
Figure 16:
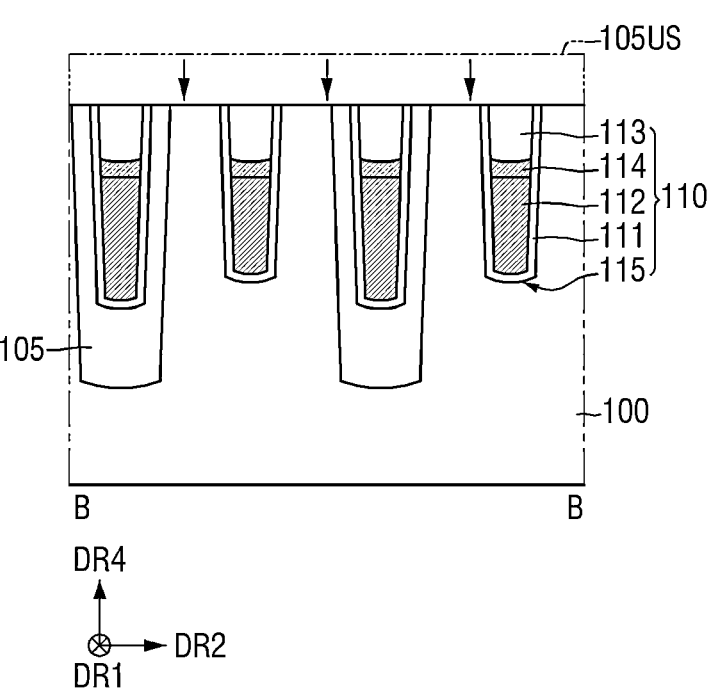

Referring to FIGS. 15 and 16, a storage contact recess 120R is formed between the cell conductive lines 140 adjacent to each other in the first direction DR1.

The storage contact recess 120R may be formed by using the bit line structure 140ST as an etching mask. The storage contact recess 120R may be formed by removing the substrate 100 and the cell element isolation layer 105. While the storage contact recess 120R is formed, a portion of the bit line spacer 150 is removed.

The storage contact recess 120R may be defined by the substrate 100, the cell element isolation layer 105, and the bit line spacer 150.

In FIG. 16, during an etching process of forming the storage contact recess 120R, portions of the substrate 100, the cell element isolation layer 105, and the cell gate capping pattern 113 are removed. For this reason, an upper surface of the cell element isolation layer 105 of FIG. 16 is lower than an upper surface 105US of the cell element isolation layer of FIG. 15. The storage contact recess 120R formed between the bit line structures 140ST may extend in the second direction DR2.

Figure 17:
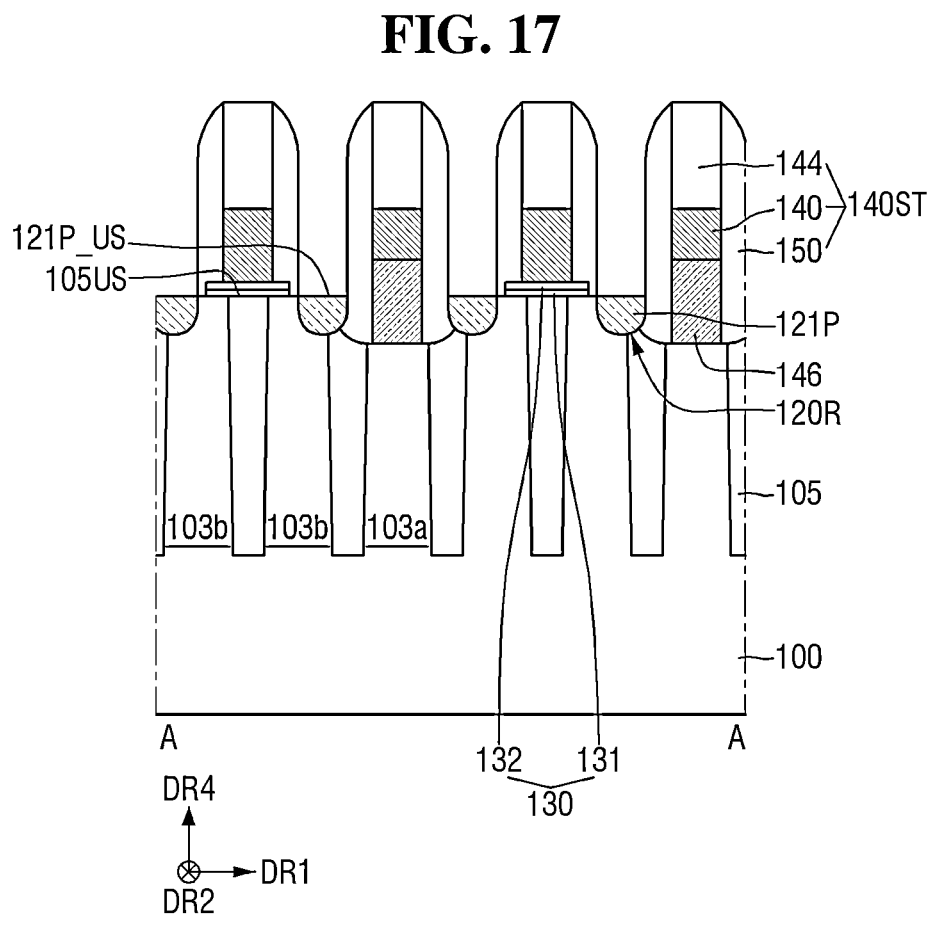
Figure 18:
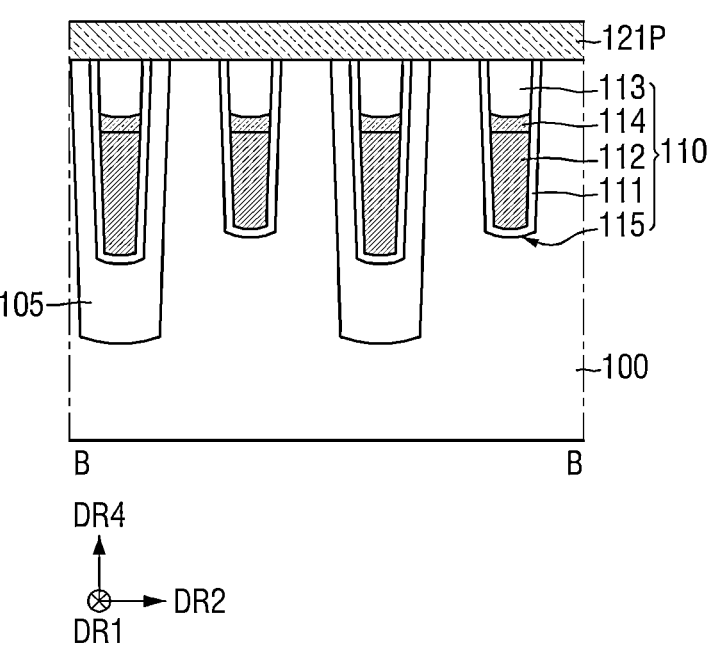

Referring to FIGS. 17 and 18, a lower contact layer 121P is formed between the bit line structures 140ST adjacent to each other in the first direction DR1.

The lower contact layer 121P is formed using an epitaxial growth method. The lower contact layer 121P may fill the storage contact recess 120R. The lower contact layer 121P extends in the second direction DR2 along the bit line structure 140ST.

For example, an upper surface 121P_US of the lower contact layer may be higher than or equal to an upper surface 105US of the cell element isolation layer.

As an example, the lower contact layer 121P may be made of an undoped semiconductor material. As another example, the lower contact layer 121P may be made of a semiconductor material doped with an n-type impurity.

By forming the lower contact layer 121P by the epitaxial growth method, a void is not generated in a portion connected to the cell active area (ACT in FIG. 12). Further, because a concentration of impurities included in the lower contact layer 121P may be adjusted, a junction depth may be maintained uniformly.

Figure 19:
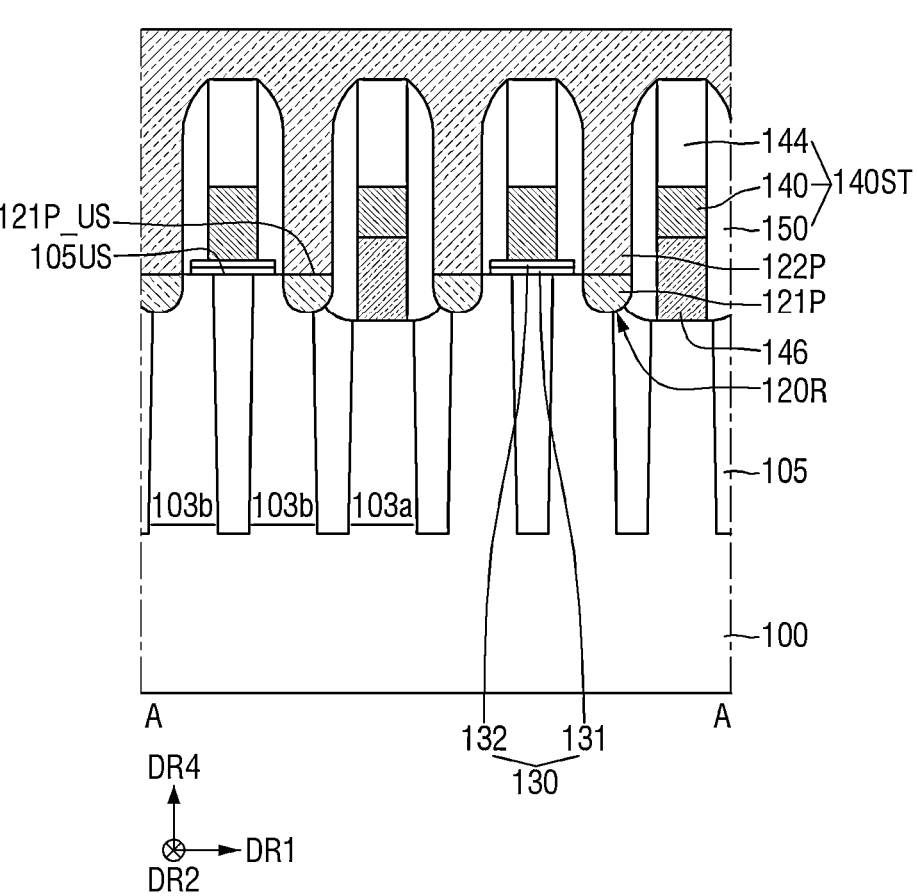
Figure 20:
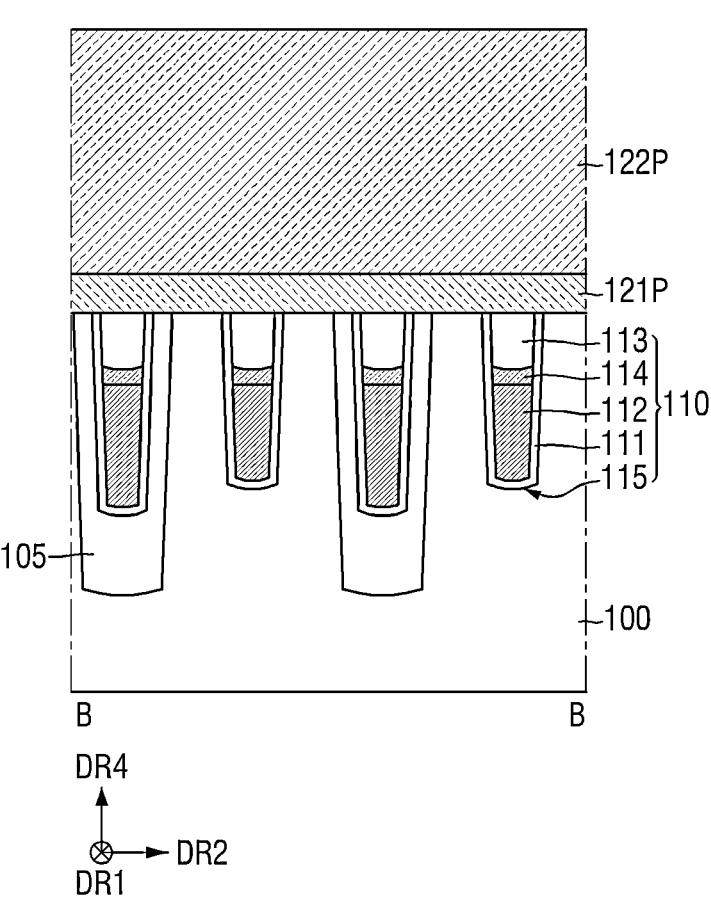

Referring to FIGS. 19 and 20, an upper contact layer 122P is formed on the lower contact layer 121P.

The upper contact layer 122P is formed along an upper surface 121P_US of the lower contact layer. The upper contact layer 122P is in contact with the lower contact layer 121P. The upper contact layer 122P may be formed through a deposition process. The upper contact layer 122P includes an n-type impurity.

The upper contact layer 122P is illustrated as covering the upper surface of the bit line structure 140ST, but is not limited thereto.

Figure 21:
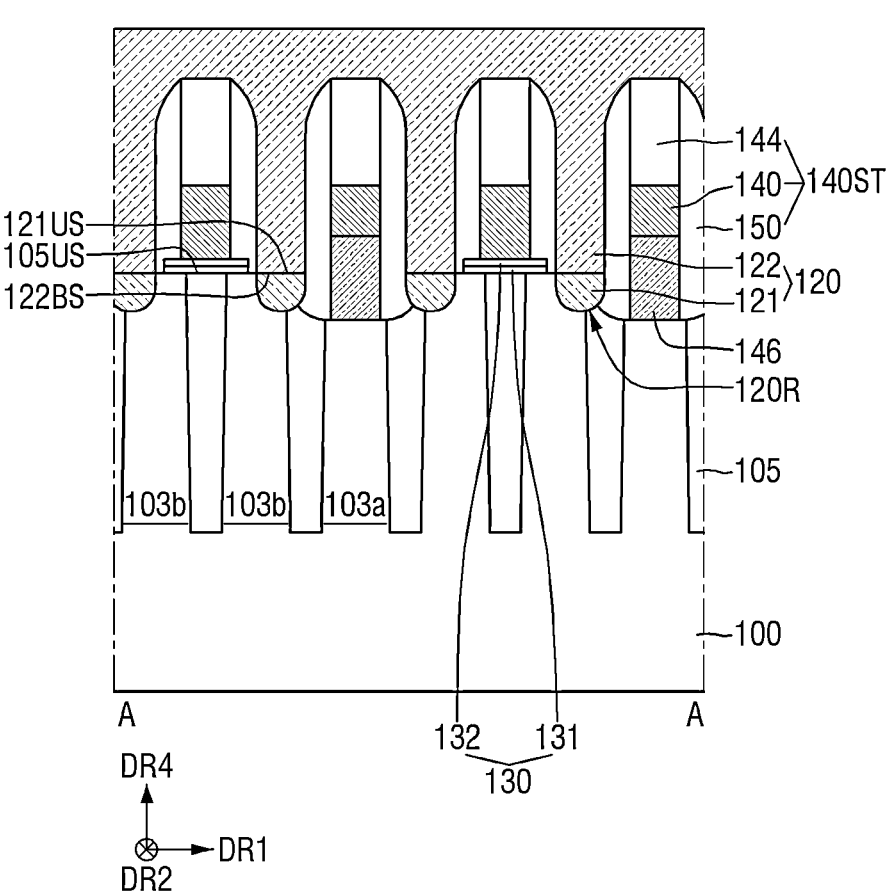
Figure 22:
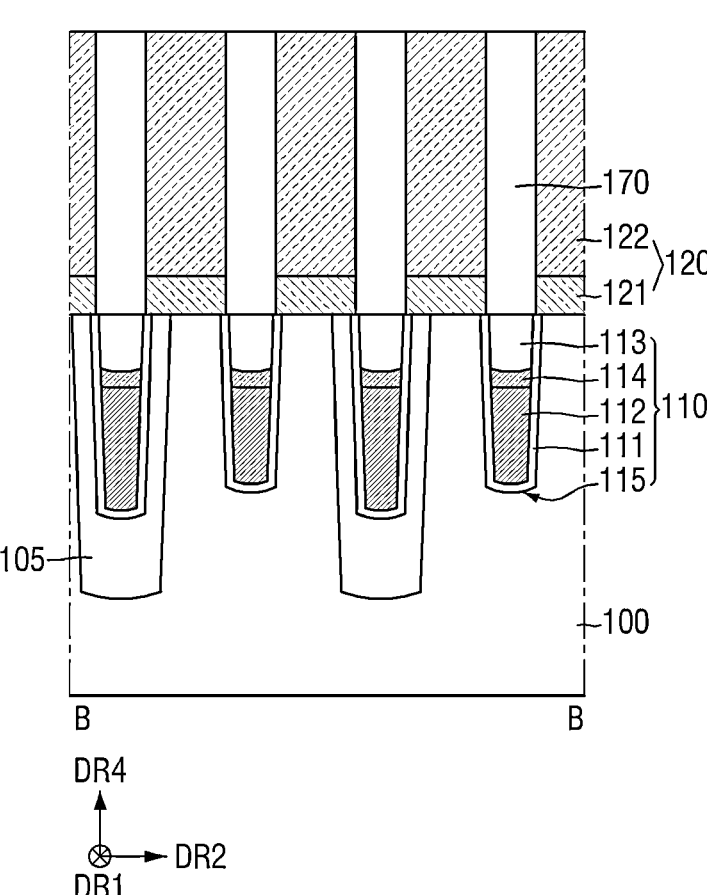

Referring to FIGS. 21 and 22, the storage contact 120 is formed by patterning the upper contact layer 122P and the lower contact layer 121P.

The upper contact layer 122P and the lower contact layer 121P are patterned using the fence pattern 170. The storage contact 120 is connected to the storage connection portion 103b of the cell active area ACT. The storage contact 120 includes a lower storage contact 121 and an upper storage contact 122.

Then, a portion of the upper storage contact 122 is removed so that the upper surface of the storage contact 120 may be lower than the upper surface of the bit line structure 140ST.

In FIGS. 3 and 4, the storage pad 160 is formed on the storage contact 120. In addition, an information storage portion 190 is formed on the storage pad 160. The information storage portion 190 may be a capacitor.

In concluding the detailed description, those skilled in the art will appreciate that many variations and modifications may be made to the disclosed example embodiments without substantially departing from the principles of the present inventive concepts. Therefore, the disclosed example embodiments of the inventive concepts are used in a generic and descriptive sense only and not for purposes of limitation.

What is claimed is:

1. A semiconductor memory device comprising:
a substrate including an active area defined by an element isolation layer;
a bit line extending in a first direction on the substrate;
a storage contact on each of both sides of the bit line and connected to the active area;
a storage pad on the storage contact and connected to the storage contact; and
an information storage portion on the storage pad and connected to the storage pad,
wherein the storage contact includes a lower storage contact and an upper storage contact on the lower storage contact,
at least a portion of the lower storage contact is in the substrate,
an entirety of an upper surface of the lower storage contact is in contact with an entirety of a lower surface of the upper storage contact, and
each of the lower storage contact and the upper storage contact includes a semiconductor material,
wherein a concentration of an n-type impurity in the upper storage contact is greater than a concentration of an n-type impurity in the lower storage contact, and
wherein the storage contact further includes an impurity pile-up area in which impurities are piled up along an interface between the upper storage contact and the lower storage contact.

2. The semiconductor memory device of claim 1, wherein a width of the upper surface of the lower storage contact in a second direction is same as a width of the lower surface of the upper storage contact in the second direction, and
the second direction is perpendicular to the first direction.

3. The semiconductor memory device of claim 1, further comprising:
a bit line spacer on a sidewall of the bit line and extending in the first direction,
wherein the lower storage contact is disposed on the bit line spacer.

4. The semiconductor memory device of claim 1, wherein the upper surface of the lower storage contact is higher than or equal to an upper surface of the element isolation layer.

5. The semiconductor memory device of claim 1, wherein the lower storage contact includes an undoped semiconductor material.

6. The semiconductor memory device of claim 1, wherein the impurities include at least one of carbon and nitrogen.

7. The semiconductor memory device of claim 1, wherein the upper surface of the lower storage contact is a flat surface in a cross-sectional view.

8. The semiconductor memory device of claim 1, wherein the upper storage contact includes a seam pattern.

9. The semiconductor memory device of claim 1, wherein the information storage portion includes a lower electrode, a capacitor dielectric layer on the lower electrode, and an upper electrode on the capacitor dielectric layer.

10. A semiconductor memory device comprising:

a substrate including an active area defined by an element isolation layer;

a bit line structure including a bit line extending in a first direction and a bit line spacer disposed on a sidewall of the bit line on the substrate;

a storage contact on each of both sides of the bit line structure and connected to the active area;

a storage pad on the storage contact and connected to the storage contact; and an information storage portion on the storage pad and connected to the storage pad, wherein the storage contact includes a lower storage contact and an upper storage contact on the lower storage contact, at least a portion of the lower storage contact is in the substrate, the bit line spacer does not extend along an upper surface of the lower storage contact, and each of the lower storage contact and the upper storage contact includes a semiconductor material, and wherein the storage contact further includes an impurity pile-up area in which impurities are piled up along an interface between the upper storage contact and the lower storage contact.

11. The semiconductor memory device of claim 10, wherein a width of the upper surface of the lower storage contact in a second direction is same as a width of a lower surface of the upper storage contact in the second direction, and the second direction is perpendicular to the first direction.

12. The semiconductor memory device of claim 10, wherein the upper surface of the lower storage contact is higher than or equal to an upper surface of the element isolation layer.

13. The semiconductor memory device of claim 10, wherein the upper surface of the lower storage contact is a flat surface in a cross-sectional view.

14. A semiconductor memory device comprising:

a substrate including an active area extending in a first direction and defined by an element isolation layer, the active area including a first portion and a second portion defined on both sides of the first portion;

a word line extending in a second direction and crossing between the first portion of the active area and the second portion of the active area, in the substrate and the element isolation layer;

a bit line extending in a third direction and connected to the first portion of the active area, on the substrate and the element isolation layer;

a storage contact on each of both sides of the bit line and connected to the second portion of the active area;

a storage pad on the storage contact and connected to the storage contact;

a contact silicide layer between the storage contact and the storage pad; and a capacitor on the storage pad and connected to the storage pad, wherein the storage contact includes a lower storage contact and an upper storage contact on the lower storage contact, and an entirety of an upper surface of the lower storage contact is in contact with an entirety of a lower surface of the upper storage contact, and wherein the storage contact further includes an impurity pile-up area in which impurities are piled up along an interface between the upper storage contact and the lower storage contact.

15. The semiconductor memory device of claim 14, wherein a width of an interface between the lower storage contact and the upper storage contact is same as a width of the upper surface of the lower storage contact and a width of the lower surface of the upper storage contact.

16. The semiconductor memory device of claim 14, further comprising:

a bit line spacer on a sidewall of the bit line and extending in the third direction, wherein the bit line spacer does not cover the upper surface of the lower storage contact.

17. The semiconductor memory device of claim 14, wherein the impurities include at least one of carbon and nitrogen.

* * * * *